United States Patent
Lim et al.

(10) Patent No.: US 10,636,940 B2
(45) Date of Patent: Apr. 28, 2020

(54) SEMICONDUCTOR LIGHT-EMITTING DEVICE

(71) Applicant: Samsung Electronics Co., Ltd., Suwon-si, Gyeonggi-do (KR)

(72) Inventors: Wan Tae Lim, Suwon-si (KR); Yong Il Kim, Seoul (KR); Nam Goo Cha, Hwaseong-si (KR); Sung Hyun Sim, Uiwang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 548 days.

(21) Appl. No.: 15/141,222

(22) Filed: Apr. 28, 2016

(65) Prior Publication Data
US 2017/0077348 A1    Mar. 16, 2017

(30) Foreign Application Priority Data
Sep. 16, 2015    (KR) .................. 10-2015-0131150

(51) Int. Cl.
*H01L 29/12* (2006.01)
*H01L 33/14* (2010.01)
(Continued)

(52) U.S. Cl.
CPC .............. *H01L 33/14* (2013.01); *H01L 33/44* (2013.01); *H01L 29/82* (2013.01); *H01L 33/40* (2013.01);
(Continued)

(58) Field of Classification Search
CPC ...... H01L 33/14–33/145; H01L 33/007; H01L 33/12; H01L 33/405; H01L 33/04–33/06;
(Continued)

(56) References Cited

U.S. PATENT DOCUMENTS

| 5,874,749 A | 2/1999 | Jonker |
| 6,372,608 B1 | 4/2002 | Shimoda et al. |

(Continued)

FOREIGN PATENT DOCUMENTS

| CN | 101188267 B | 5/2008 |
| CN | 102456796 A | 5/2012 |

(Continued)

OTHER PUBLICATIONS

Chinese Office Action dated Jul. 4, 2018 issued in corresponding Chinese Office Action 201610825789.3.

*Primary Examiner* — Jarrett J Stark
(74) *Attorney, Agent, or Firm* — Harness, Dickey & Pierce, P.L.C.

(57) ABSTRACT

A semiconductor light-emitting device includes a light-emitting structure including a first conductivity-type semiconductor layer, an active layer, and a second conductivity-type semiconductor layer, and a magnetic layer on the light-emitting structure. The magnetic layer may have at least one magnetization direction that is parallel to an upper surface of the active layer. The magnetic layer may generate a magnetic field that is parallel to the upper surface of the active layer. The magnetic layer may include multiple structures that may have different magnetization directions. Multiple magnetic layers may be included on the light-emitting structure. A magnetic layer may be on a contact electrode. A magnetic layer may be isolated from a pad electrode.

11 Claims, 34 Drawing Sheets

(51) Int. Cl.
*H01L 33/44* (2010.01)
*H01L 29/82* (2006.01)
*H01L 33/40* (2010.01)

(52) U.S. Cl.
CPC ............... *H01L 2224/48091* (2013.01); *H01L 2224/48227* (2013.01); *H01L 2224/48237* (2013.01); *H01L 2224/49107* (2013.01); *H01L 2224/73265* (2013.01); *H01L 2924/181* (2013.01)

(58) Field of Classification Search
CPC ............... H01L 33/36–42; H01L 33/62; H01L 2933/0016; H01L 2933/0066; H01L 29/82
USPC .................................. 257/13, 94, 99
See application file for complete search history.

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,858,991 B2 | 12/2010 | Xuan et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,536,614 B2 | 9/2013 | Hsu et al. | |
| 8,735,931 B2 | 5/2014 | Han et al. | |
| 8,766,295 B2 | 7/2014 | Kim | |
| 8,794,530 B2 | 8/2014 | Holmes et al. | |
| 9,136,433 B2 * | 9/2015 | Park .................. | H01L 33/46 |
| 2006/0186432 A1 | 8/2006 | Osipov et al. | |
| 2006/0273335 A1 * | 12/2006 | Asahara ............ | H01L 33/405 |
| | | | 257/98 |
| 2008/0128721 A1 | 6/2008 | Watanabe et al. | |
| 2009/0179209 A1 | 7/2009 | Xuan et al. | |
| 2009/0179214 A1 | 7/2009 | Xuan et al. | |
| 2009/0179218 A1 | 7/2009 | Hsu et al. | |
| 2012/0043571 A1 | 2/2012 | Chu et al. | |
| 2012/0098024 A1 * | 4/2012 | Hsu .................. | H01L 33/38 |
| | | | 257/99 |
| 2013/0313591 A1 * | 11/2013 | Shimada ............ | H01L 33/486 |
| | | | 257/98 |
| 2013/0320382 A1 | 12/2013 | Kojima et al. | |
| 2014/0268698 A1 | 9/2014 | Zimmerman et al. | |
| 2015/0091036 A1 * | 4/2015 | Park .................. | H01L 33/46 |
| | | | 257/98 |
| 2015/0097205 A1 | 4/2015 | Park et al. | |
| 2017/0077348 A1 * | 3/2017 | Lim .................. | H04L 33/14 |

FOREIGN PATENT DOCUMENTS

| | | |
|---|---|---|
| CN | 102479893 A | 5/2012 |
| CN | 103403889 A | 11/2013 |
| KR | 10-1219120 | 1/2013 |
| KR | 1291153 | 7/2013 |
| KR | 10-2015-0038861 A | 4/2015 |
| KR | 10-1517481 | 5/2015 |
| WO | WO-2012/091275 A1 | 7/2012 |

\* cited by examiner

SEMICONDUCTOR LIGHT-EMITTING DEVICE

CROSS-REFERENCE TO RELATED APPLICATION

This application claims the priority and benefit of Korean Patent Application No. 10-2015-0131150, filed on Sep. 16, 2015 with the Korean Intellectual Property Office, the inventive concept of which is incorporated herein by reference.

BACKGROUND

Example embodiments of the inventive concepts relate to a semiconductor light-emitting device.

Semiconductor light-emitting devices include light-emitting diodes (LEDs) or the like, and are seeing widespread use in various fields as light sources due to a number of advantages thereof, such as lower power consumption, higher luminance levels, longer lifespans, and the like. Semiconductor light-emitting devices generate light having various wavelength bands by using energy generated through electron-hole recombination.

Accordingly, in order to improve efficiency of a semiconductor light-emitting device, it may be advantageous to increase a probability of electron-hole recombination. Recently, research into increasing the probability of electron-hole recombination of a semiconductor light emitting device by forcing electrons and holes to be confined in an active layer of the semiconductor light emitting device has been actively conducted.

SUMMARY

Some example embodiments of the inventive concepts may provide a semiconductor light-emitting device having improved light extraction efficiency by applying a magnetic field to confine electrons and holes in an active layer using a force generated by the magnetic field, thereby increasing a probability of electron-hole recombination.

According to some example embodiments of the inventive concepts, a semiconductor light-emitting device may include a substrate, a light-emitting structure on the substrate, a first contact electrode, a second contact electrode, an insulating layer on the light-emitting structure. The light-emitting structure may include a plurality of layers. The plurality of layers may include a first conductivity-type semiconductor layer, an active layer, and a second conductivity-type semiconductor layer. The first contact electrode may be coupled to the first conductivity-type semiconductor layer. The second contact electrode may be coupled to the second conductivity-type semiconductor layer. The insulating layer may cover the first and second contact electrodes, the insulating layer may include a magnetic layer, and first and second pad electrodes respectively coupled to the first and second contact electrodes. Each of the first and second pad electrodes including coplanar upper surfaces.

According to some example embodiments of the inventive concepts, a semiconductor light-emitting device may include a substrate, a light-emitting structure including a plurality of layers stacked on the substrate, an insulating layer on the light-emitting structure, and a magnetic layer. At least a portion of the light-emitting structure may define a trench. The plurality of layers may include a first conductivity-type semiconductor layer, an active layer, and a second conductivity-type semiconductor layer. The insulating layer may include a reflective metal layer on the portion of the light-emitting structure defining the trench. The magnetic layer may be on the reflective metal layer.

According to some example embodiments of the inventive concepts, a semiconductor light-emitting device may include a substrate, a light-emitting structure including a stack of layers stacked on the substrate, a first contact electrode, a second contact electrode, a first pad electrode coupled to the first contact electrode, a second pad electrode coupled to the second contact electrode, and a magnetic layer on the second contact electrode, the magnetic layer being isolated from the second pad electrode. The stack of layer may include a first conductivity-type semiconductor layer, an active layer, and a second conductivity-type semiconductor layer. The first contact electrode may be coupled to the first conductivity-type semiconductor layer. The second contact electrode may be coupled to the second conductivity-type semiconductor layer.

According to some example embodiments of the inventive concepts, a semiconductor light-emitting device may include a light-emitting structure and a magnetic layer. The light-emitting structure may include an active layer. The light-emitting structure may be configured to induce a current in a first direction through the active layer, the first direction being substantially perpendicular to an upper surface of the active layer. The magnetic layer may be configured to generate a magnetic field having a magnetic field direction at the active layer, the magnetic field direction at the active layer being substantially parallel to the upper surface of the active layer.

In some example embodiments, the magnetic layer may include a plurality of structures. The plurality of structure may at least partially define a pattern. Each of the structures may be configured to generate a magnetic field having a common magnetic field direction at the active layer.

In some example embodiments, the magnetic layer may include a plurality of structures. The plurality of structures may at least partially define a pattern. The plurality of structures may include at least one structure and at least one remaining structure. The at least one structure may be configured to generate a magnetic field having a first magnetic field direction at the active layer. The at least one remaining structure may be configured to generate a magnetic field having a second magnetic field direction at the active layer. The first and second magnetic field directions at the active layer may be substantially parallel to the upper surface of the active layer. The first and second magnetic field directions at the active layer may be different directions.

In some example embodiments, the magnetic layer may include at least one of a plurality of line structures extending substantially parallel to the upper surface of the active layer and a plurality of dot structures spaced apart from each other on the light-emitting structure.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 13 is a cross-sectional view of a quantum dot employable in a semiconductor light-emitting device package according to some example embodiments of the inventive concepts;

DETAILED DESCRIPTION

Figure 1:
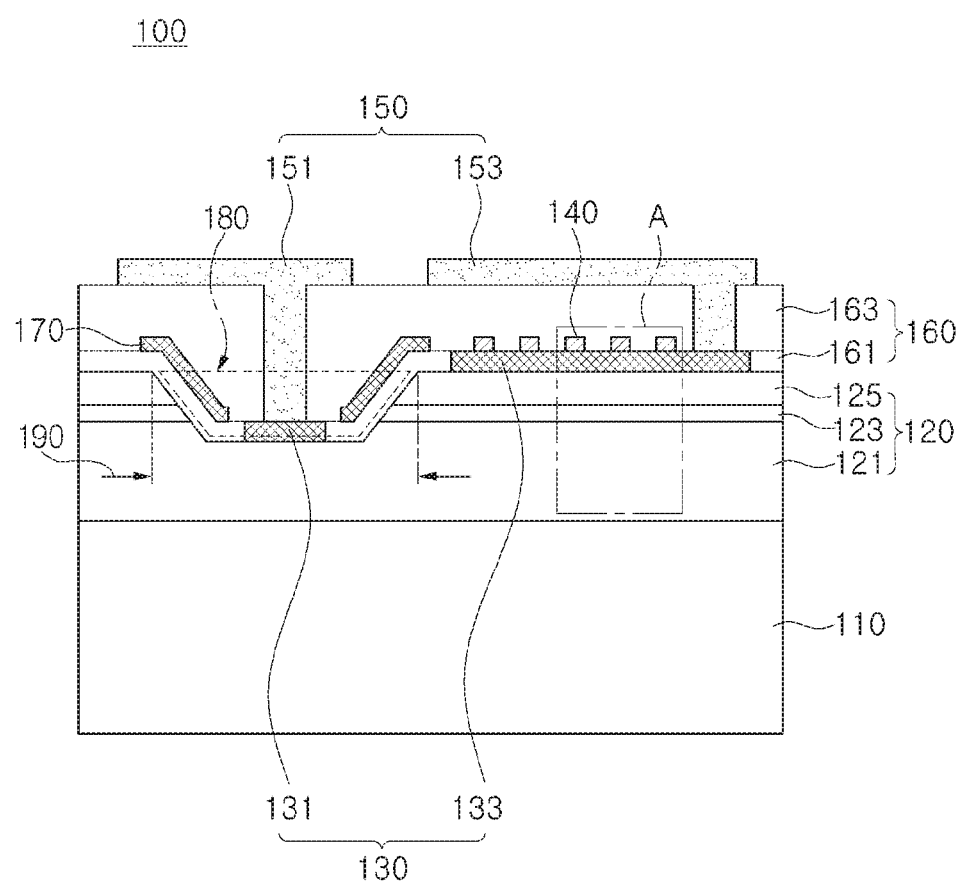
FIG. 1 is a cross-sectional view of a semiconductor light-emitting device according to some example embodiments of the inventive concepts.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particular manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a cross-sectional view of a semiconductor light-emitting device according to some example embodiments of the inventive concepts.

Referring to FIG. 1, a semiconductor light-emitting device 100 according to an example embodiment may include a substrate 110, a light-emitting structure 120 disposed on the substrate 110, a contact electrode 130 electrically connected to first and second conductivity-type semiconductor layers 121 and 125 included in the light-emitting structure 120, and a magnetic layer 140. The light-emitting structure 120 may include the first and second conductivity-type semiconductor layers 121 and 125, and an active layer 123 disposed therebetween. The contact electrode 130 may include first and second contact electrodes 131 and 133, and the first and second contact electrodes 131 and 133 may be electrically connected to the first and second conductivity-type semiconductor layers 121 and 125, respectively.

The first conductivity-type layer 121 and the second conductivity-type layer 125 included in the light-emitting structure 120 may be an n-type semiconductor layer and a p-type semiconductor layer. In some example embodiments, the first and second conductivity-type semiconductor layers 121 and 125 may be formed of a Group III nitride semiconductor, such as a material having a composition of $Al_xIn_yGa_{1-x-y}N$ ($0 \leq x \leq 1$, $0 \leq y \leq 1$, and $0 \leq x+y \leq 1$). However, the first and second conductivity-type semiconductor layers 121 and 125 are not limited thereto, and may be formed of an AlGaInP-based semiconductor or an AlGaAs-based semiconductor.

The first and second conductivity-type semiconductor layers 121 and 125 may be formed to have single-layer structures. Alternatively, the first and second conductivity-type semiconductor layers 121 and 125 may be formed to have multilayer structures having different compositions, thicknesses, or the like, as needed. For example, each of the first and second conductivity-type semiconductor layers 121 and 125 may include a carrier injection layer to improve an injection efficiency of electrons and holes, and may have a superlattice structure in various forms.

The first conductivity-type layer 121 may further include a current-spreading layer disposed adjacent to the active layer 123. The current-spreading layer may have a structure in which a plurality of $In_xAl_yGa_{(1-x-y)}N$ layers having different compositions or different impurity concentrations are repeatedly stacked, or an insulating layer may be partially formed.

The second conductivity-type layer 125 may further include an electron blocking layer disposed adjacent to the active layer 123. The electron blocking layer may have a structure in which a plurality of $In_xAl_yGa_{(1-x-y)}N$ layers having different compositions are stacked, or a structure including one or more $Al_yGa_{(1-y)}N$ layers. In addition, the electron blocking layer may have a greater bandgap than the active layer 123, thereby reducing and/or preventing electrons from moving to the second conductivity-type layer 125.

The semiconductor light-emitting device 100 may be formed using a metal organic chemical vapor deposition (MOCVD) apparatus. In order to fabricate the semiconductor light-emitting device 100, a gallium nitride-based compound semiconductor may be grown on a growing substrate while supplying an organic metal compound gas (e.g. trimethyl gallium (TMG) or trimethyl aluminum (TMA)) and a nitrogen-containing gas (e.g. ammonia ($NH_3$)) as reaction gases into a reaction vessel in which the growing substrate is mounted and maintaining the growing substrate at a high temperature of about 900° C. to 1100° C. As needed, an undoped n-type or p-type gallium nitride-based compound semiconductor may be stacked by supplying an impurity gas. The n-type impurities may be silicon (Si), and the p-type impurities may be Zn, Cd, Be, Mg, Ca, Ba, or the like. Usually, Mg or Zn may be used as the p-type impurities.

In addition, the active layer 123 disposed between the first and second conductivity-type semiconductor layers 121 and 125 may have a multiple quantum well (MQW) structure in which quantum well layers and quantum barrier layers are alternately stacked. When the active layer 123 includes a nitride semiconductor, the active layer 123 may have a MQW structure in which GaN and InGaN are alternately stacked. In some example embodiments, the active layer 123 may have a single quantum well (SQW) structure.

The first conductivity-type layer 121 may be exposed in a trench 190 formed by partially removing a portion 180 of the light-emitting structure 120, and a first contact electrode 131 may be formed in the trench 190 on which the first conductivity-type layer 121 is exposed. As shown, at least a portion 180 of the light-emitting structure 120 defines the trench 190. The first and second contact electrodes 131 and 133 may be electrically connected to the first and second conductivity-type semiconductor layers 121 and 125, respectively, as illustrated in FIG. 1.

The semiconductor light-emitting device 100 according to the example embodiments illustrated in FIG. 1 may be installed in a package in a flip-chip scheme so that light is emitted in a direction toward the substrate 110. In addition, in order to increase light extraction efficiency in the direction toward the substrate 110, the first and second contact electrodes 131 and 133 may include a material having a relatively high reflectance. In addition, a reflective metal layer 170 may be additionally formed on a side surface of the trench 190 to further improve the light extraction efficiency in the direction toward the substrate 110. The first and second contact electrodes 131 and 133 and the reflective metal layer 170 may include at least one of Ag, Al, Ni, Cr, Cu, Au, Pd, Pt, Sn, W, Rh, Ir, Ru, Mg, Zn, and an alloy including thereof. That is, the contact electrode 130, like the reflective metal layer 170, may also be formed of a metal having a relatively high reflectance to reflect light generated in the active layer 123.

An insulating layer 160 may be formed on the contact electrode 130 and the reflective metal layer 170, and a pad electrode 150 passing through the insulating layer 160 may be electrically connected to the contact electrode 130. The insulating layer 160 may include first and second insulating layers 161 and 163. In some example embodiments, the first insulating layer 161 may be formed on the second conductivity-type layer 125, and the second insulating layer 163 may be formed on the first insulating layer 161. In the manufacturing process, the first insulating layer 161 may be formed after the first and second contact electrodes 131 and 133 are formed, and the second insulating layer 163 may be formed after the reflective metal layer 170 and the magnetic layer 140 are formed. Referring to the example embodiments illustrated in FIG. 1, the reflective metal layer 170 may be surrounded by the insulating layer 160, and a portion of an upper surface and a side surface of the contact electrode 130 may be covered by the insulating layer 160.

The pad electrode 150 may include first and second pad electrodes 151 and 153 respectively connected to the first and second contact electrodes 131 and 133. The pad electrode 150 may include a metal similar to the first and second contact electrodes 131 and 133, and may be bonded with the package substrate by a solder bump or the like. Upper surfaces of the first and second pad electrodes 151 and 153 may be coplanar. Since the upper surfaces of the first and second pad electrodes 151 and 153 may be coplanar, the semiconductor light-emitting device 100 may be easily mounted on the package substrate.

According to some example embodiments, the magnetic layer 140 having a desired (and/or alternatively predetermined) pattern may be formed on the second contact electrode 133. In the example embodiments illustrated in FIG. 1, the magnetic layer 140 may have a line pattern including a plurality of line structures extending parallel or substantially parallel to an upper surface of the substrate 110. The magnetic layer 140 may include at least one of Fe, Co, Ni, Cr and an alloy including thereof. A magnetization direction of a plurality of structures included in the magnetic layer 140 may be parallel or substantially parallel to an upper surface of the active layer 123. A magnetic field generated by the magnetic layer 140 may have a magnetic field direction at the active layer 123 that is parallel or substantially parallel to the upper surface of the active layer 123.

In some example embodiments, the magnetic layer 140 may be formed to have a dot pattern, a coil pattern, or a surface structure. Even when the magnetic layer 140 has the surface structure or the dot pattern, a direction of a magnetic field generated by the magnetic layer 140 may be parallel or substantially parallel to the upper surface of the active layer 123 at the active layer 123.

In the example embodiments illustrated in FIG. 1, the magnetic layer 140 may be formed on the second contact electrode 133, and the insulating layer 160 may be formed on the upper and side surfaces of the magnetic layer 140. That is, the magnetic layer 140 may be included in the insulating layer 160, and the insulating layer 160 may be disposed between the magnetic layer 140 and the second pad electrode 153. Accordingly, the magnetic layer 140 may not be in direct contact with the second pad electrode 153, and a power signal transmitted via the second pad electrode 153 may not be directly applied to the magnetic layer 140.

Since currents flow in a direction from the second conductivity-type layer 125 toward the first conductivity-type layer 121, that is, a direction perpendicular to the upper surface of the substrate 110, in the semiconductor light-emitting device 100, electrons or holes moving in the semiconductor light-emitting device 100 receive a force parallel or substantially parallel to the upper surface of the substrate 110 when the magnetization direction of the magnetic layer 140 is parallel or substantially parallel to the upper surface of the active layer 123. Accordingly, the electrons or holes may remain in the active layer 123 for a relatively long time without escaping from the active layer 123, and a probability of electron-hole recombination may increase, thereby improving the light extraction efficiency. This will be described hereinafter with reference to FIGS. 2A and 2B.

Figure 2A:
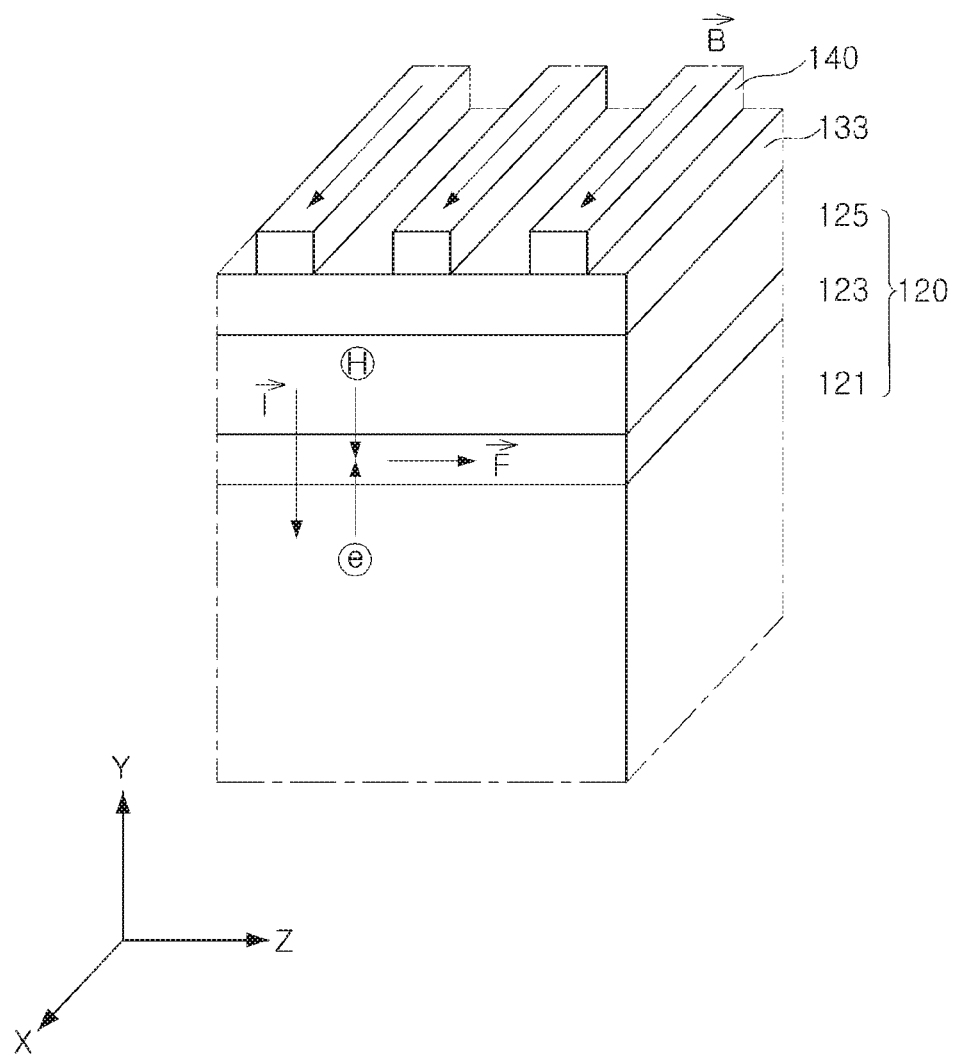
FIGS. 2A and 2B are enlarged views of the area A of the semiconductor light-emitting device illustrated in FIG. 1.
Figure 2B:
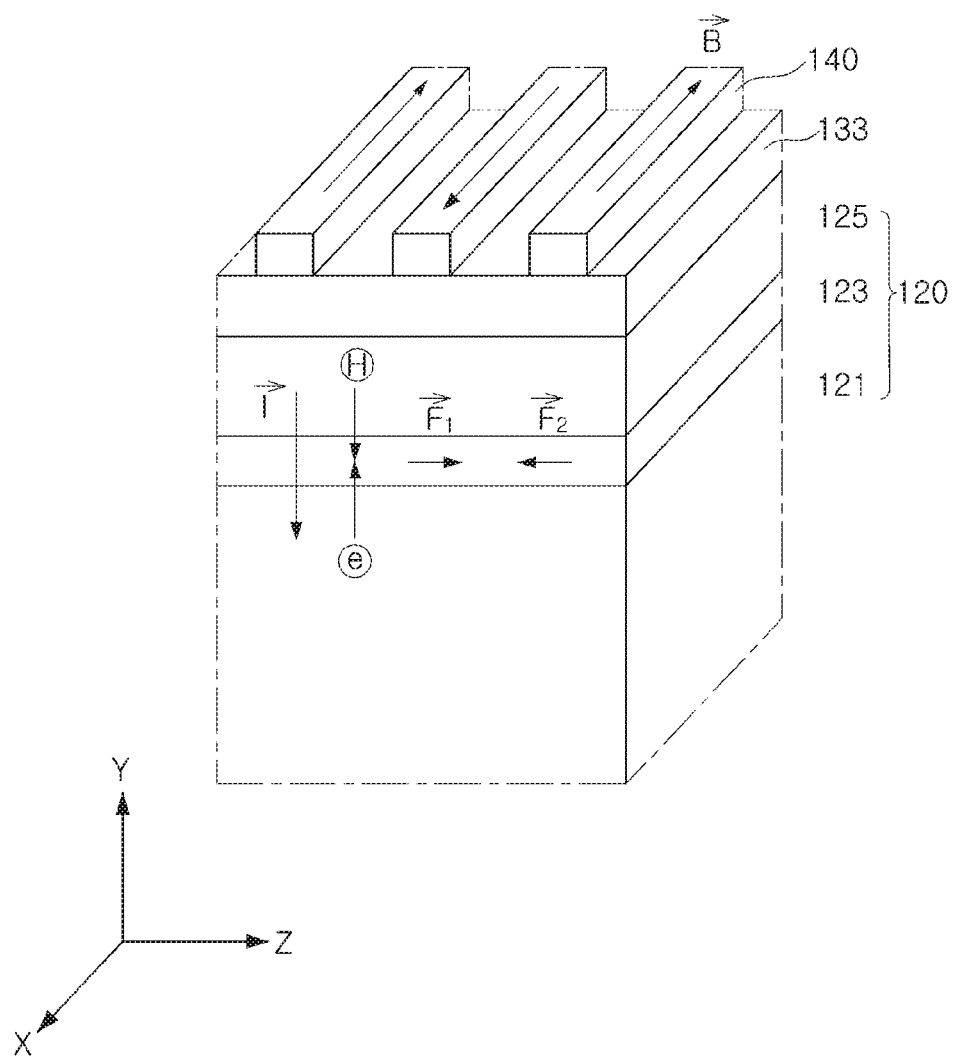

FIGS. 2A and 2B are enlarged views of area A of the semiconductor light-emitting device illustrated in FIG. 1.

First, referring to FIG. 2A, the light-emitting structure 120 in which the first conductivity-type layer 121, the active layer 123, and the second conductivity-type layer 125 are sequentially stacked, the second contact electrode 133 formed on the second conductivity-type layer 125, and the magnetic layer 140 formed on the second contact electrode 133 are illustrated. The magnetic layer 140 may include a plurality of line structures extending in a direction parallel or substantially parallel to the upper surface of the active layer 123 (the x-axis direction in FIG. 2A). A magnetization direction of each of the plurality of the line structures included in the magnetic layer 140 may be an arbitrary direction parallel or substantially parallel to the upper surface of the substrate 110. In the example embodiments illustrated in FIG. 2A, the magnetization direction of the magnetic layer 140 may be defined as a positive x-axis direction.

If and/or when a desired (and/or alternatively predetermined) voltage is applied through the pad electrode 150 and the contact electrode 130, currents may flow in the light-emitting structure 120. The currents may flow from the second conductivity-type layer 125 to the first conductivity-type layer 121, as illustrated in FIG. 2A. This occurs when the first conductivity-type layer 121 is doped with n-type impurities and the second conductivity-type layer 125 is doped with p-type impurities. When it is vice versa, the currents flow from the first conductivity-type layer 121 to the second conductivity-type layer 125. The currents may flow through the active layer 123, such that the currents flow perpendicular or substantially perpendicular to the upper surface of the active layer 123.

As the example embodiments illustrated in FIG. 2A, when the currents flow in the direction from the second conductivity-type layer 125 to the first conductivity-type layer 121 (in a negative y-axis direction), electrons and holes may receive a force in the direction parallel or substantially parallel to the upper surface of the substrate 110 (in a positive z-axis direction). Such a force may be based on the magnetic field at the active layer 123, where the direction of the magnetic field at the active layer 123 is parallel or substantially parallel to the upper surface of the active layer 123. Accordingly, the electrons and holes may be confined in the active layer 123 without escaping from the active layer 123, and the probability of electron-hole recombination may be increased, thereby improving the light extraction efficiency.

Referring to FIG. 2B, portions of the plurality of line structures included in the magnetic layer 140 may have different magnetization directions. In the example embodiments illustrated in FIG. 2B, a line structure disposed in the center may have a first magnetization direction in the positive x-axis direction, and the other line structures (e.g., remaining structures) may have a second magnetization direction in the negative x-axis direction.

When the second conductivity-type layer 125 is doped with p-type impurities, and the first conductivity-type layer 121 is doped with n-type impurities, the current may flow in the negative y-axis direction in the light-emitting structure 120 as illustrated in FIG. 2B. Accordingly, electrons and holes may receive a force $F_1$ applied in the positive z-axis direction by the line structure disposed in the center, and a force $F_2$ applied in the negative z-axis direction by the other line structures. As a result, electrons and holes may receive a force in the direction parallel or substantially parallel to the upper surface of the substrate 110 by the magnetic layer 140. Since the electrons and holes remain for a relatively long-time in the active layer 123, the probability of electron-hole recombination may increase.

Figure 3A:
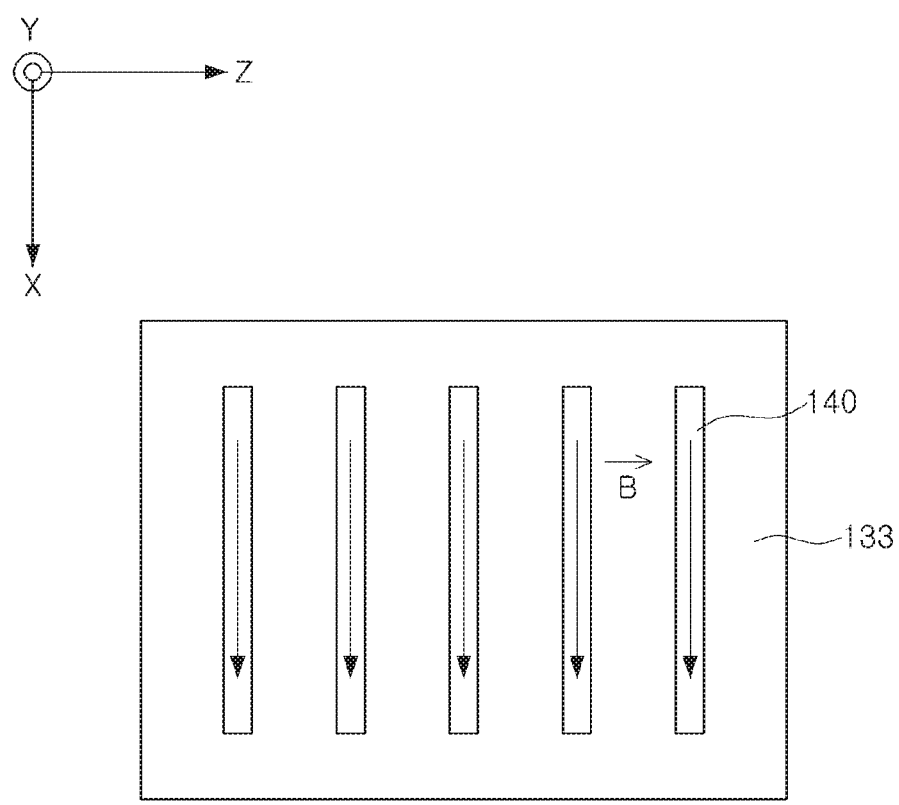
FIGS. 3A, 3B, and 3C are plan views illustrating magnetic layers applicable to a semiconductor light-emitting device according to some example embodiments of the inventive concepts.
Figure 3B:
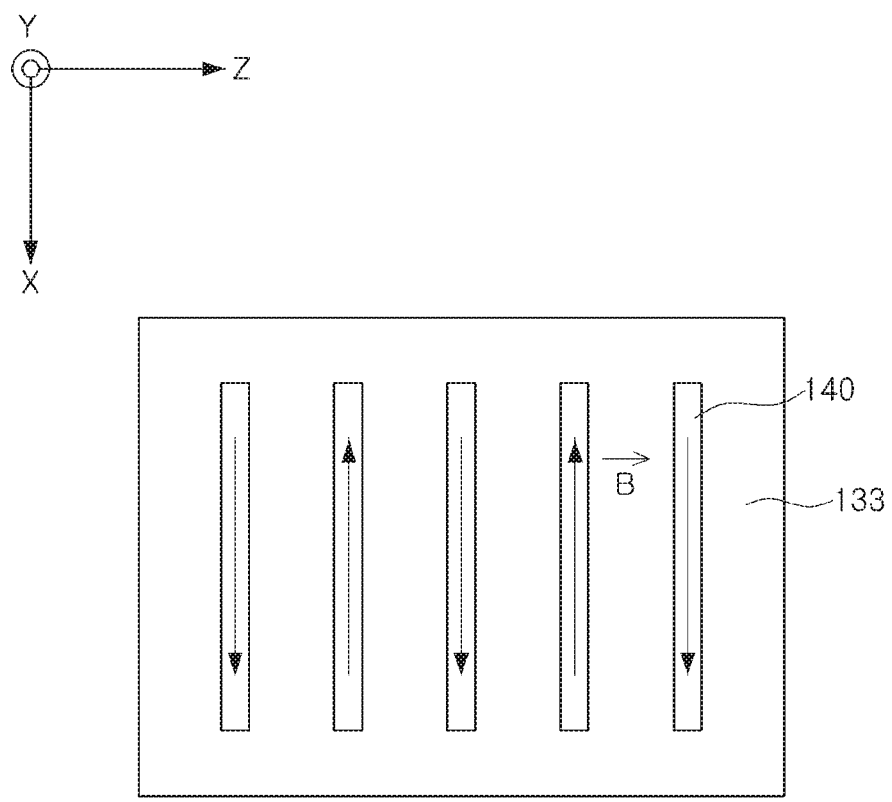
Figure 3C:
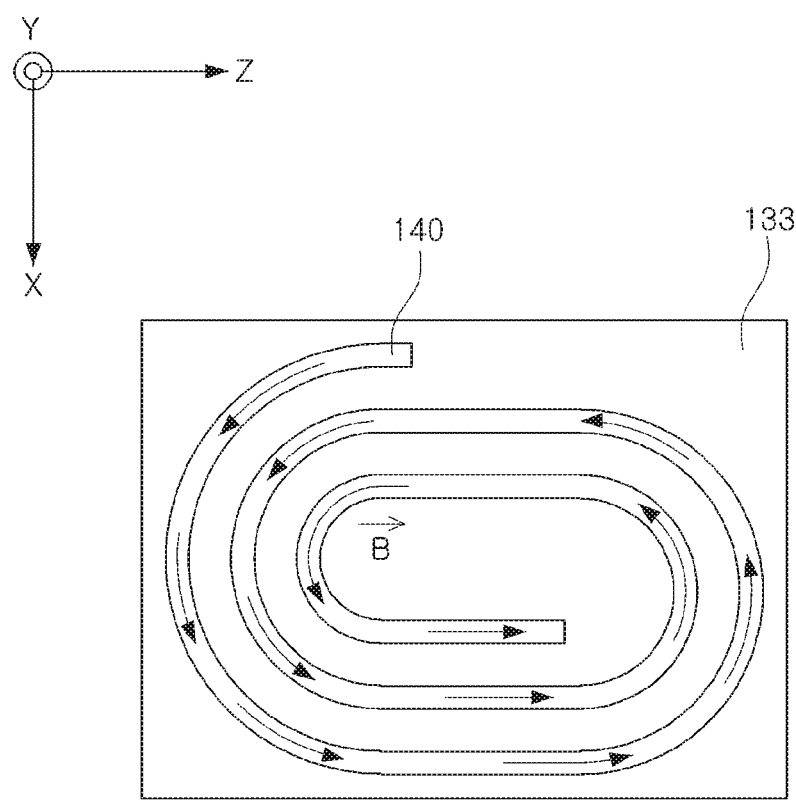

FIGS. 3A, 3B, and 3C are plan views illustrating magnetic layers applicable to a semiconductor light-emitting device according to some example embodiments of the inventive concepts.

Referring to FIGS. 3A, 3B, and 3C, a magnetic layer 140 adoptable in a semiconductor light-emitting device 100 according to an example embodiment may have a desired (and/or alternatively predetermined) pattern (e.g., may define a pattern). Although the magnetic layer 140 is illustrated as being disposed on a second contact electrode 133 of the semiconductor light-emitting device 100 in FIGS. 3A, 3B, and 3C, the magnetic layer 140 may be disposed in another position as long as it is adjacent to the active layer 123 of the semiconductor light-emitting device 100.

First, referring to FIGS. 3A and 3B, the magnetic layer 140 may have a line shape extending in a specific direction (the x-axis direction in FIGS. 3A and 3B). Here, each magnetic layer 140 may have a width in the range of 0.1 μm to 100 μm. In addition, in FIGS. 3A and 3B, although an area in which the magnetic layer 140 occupies the upper surface of the second contact electrode 133 is illustrated as being smaller than the other area in which the magnetic layer 140 is not disposed, it may be vice versa. That is, the area in which the magnetic layer 140 is disposed may be 50% the entire area of the upper surface of the second contact electrode 133, or more.

Referring to FIG. 3C, the magnetic layer 140 may have not a line shape but a spiral shape. Here, a direction of a magnetic field generated by the magnetic layer 140 may follow a direction of the spiral shape of the magnetic layer 140. Accordingly, the direction of the magnetic field may be different depending on a location in the active layer 123. If and/or when the magnetic layer 140 has the spiral shape, a width of the magnetic layer 140 may be 0.1 μm to 100 μm.

In the example embodiments illustrated in FIG. 3C, the direction of the magnetic field may be parallel or substantially parallel to an x-z plane (the upper surface of the active layer 123). Accordingly, even when electric fields having different directions according to the locations in the active layer 123 are applied, electrons and holes in the active layer 123 may receive a force in the direction parallel or substantially parallel to the x-z plane. Therefore, the electrons and holes may remain in the active layer 123 for a relatively long time, and the efficiency of electron-hole recombination may be improved.

That is, as illustrated in FIGS. 3A, 3B, and 3C, the shape of the magnetic layer 140 according to the example embodiment may not be specifically limited, and may include all shapes as long as they provide a magnetic field in the direction parallel or substantially parallel to the upper surface of the active layer 123 at the active layer 123. Besides the line shape or the spiral shape, the magnetic layer 140 may have a dot shape including a plurality of dot structures separated from each other, or a plane shape having a cross-section of a polygonal structure, such as a square or triangle, or a circular structure.

FIGS. 4, 5, 6, 7, 8, 9, and 10 are cross-sectional views illustrating a semiconductor light-emitting device according to some example embodiments of the inventive concepts.

Figure 4:
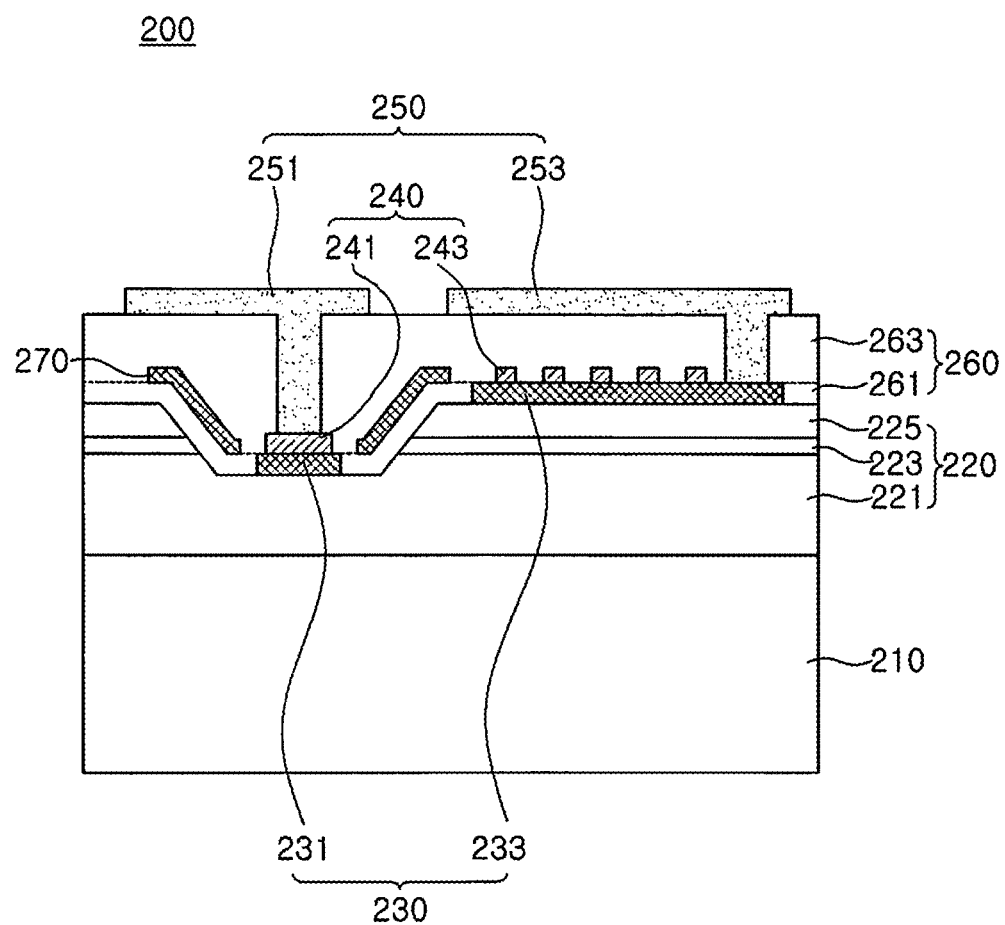
FIGS. 4, 5, 6, 7, 8, 9, and 10 are cross-sectional views illustrating a semiconductor light-emitting device according to some example embodiments of the inventive concepts.

Referring to FIG. 4, a semiconductor light-emitting device 200 according to an example embodiment may include a substrate 210, a light-emitting structure 220, a contact electrode 230, a magnetic layer 240, and a pad electrode 250, disposed on the substrate 210. The light-emitting structure 220 may include first and second conductivity-type semiconductor layers 221 and 225 and an active layer 223 interposed therebetween. The first and second conductivity-type semiconductor layers 221 and 225 may be electrically connected to first and second contact electrodes 231 and 233, respectively. In addition, an insulating layer 260 may be formed on the second conductivity-type semiconductor layer 225, and a pad electrode 250 may pass through the insulating layer 260 to be electrically connected to the contact electrode 230. The semiconductor light-emitting device 200 may be mounted on a package substrate for flip-chip packaging. In order to increase the light extraction efficiency in a direction toward the substrate 210, a reflective metal layer 270 may be formed in a trench exposing the first conductivity-type semiconductor layer 221.

In the example embodiments illustrated in FIG. 4, the magnetic layer 240 may include first and second magnetic layers 241 and 243 formed adjacent to the first and second conductivity-type semiconductor layers 221 and 225, respectively. That is, the first magnetic layer 241 may be formed adjacent to the first conductivity-type semiconductor layer 221, and the second magnetic layer 243 may be formed adjacent to the second conductivity-type semiconductor layer 225.

A magnetization direction of the first and second magnetic layers 241 and 243 may cross a direction of currents flowing in the light-emitting structure 220, and may be parallel or substantially parallel to an upper surface of the substrate 210. Accordingly, due to magnetic fields generated by the first and second magnetic layers 241 and 243 and the currents flowing through the light-emitting structure 220, electrons and holes may receive a force in a direction parallel or substantially parallel to an upper surface of the active layer 223 in the light-emitting structure 220. The electrons and holes may stay in the active layer 223 for a relatively long time by the force generated by the magnetic layer 240 and the currents, the probability of electron-hole recombination may be increased, and the light extraction efficiency may be improved.

In the example embodiments illustrated in FIG. 4, the first magnetic layer 241 may be disposed between the first contact electrode 231 and the first pad electrode 251. The first magnetic layer 241 may include a metal the same as the contact electrode 230 and the pad electrode 250. Accordingly, the first conductivity-type semiconductor layer 221 may receive an electrical signal from an external source via the first pad electrode 251, the first magnetic layer 241, and the first contact electrode 231.

Figure 5:
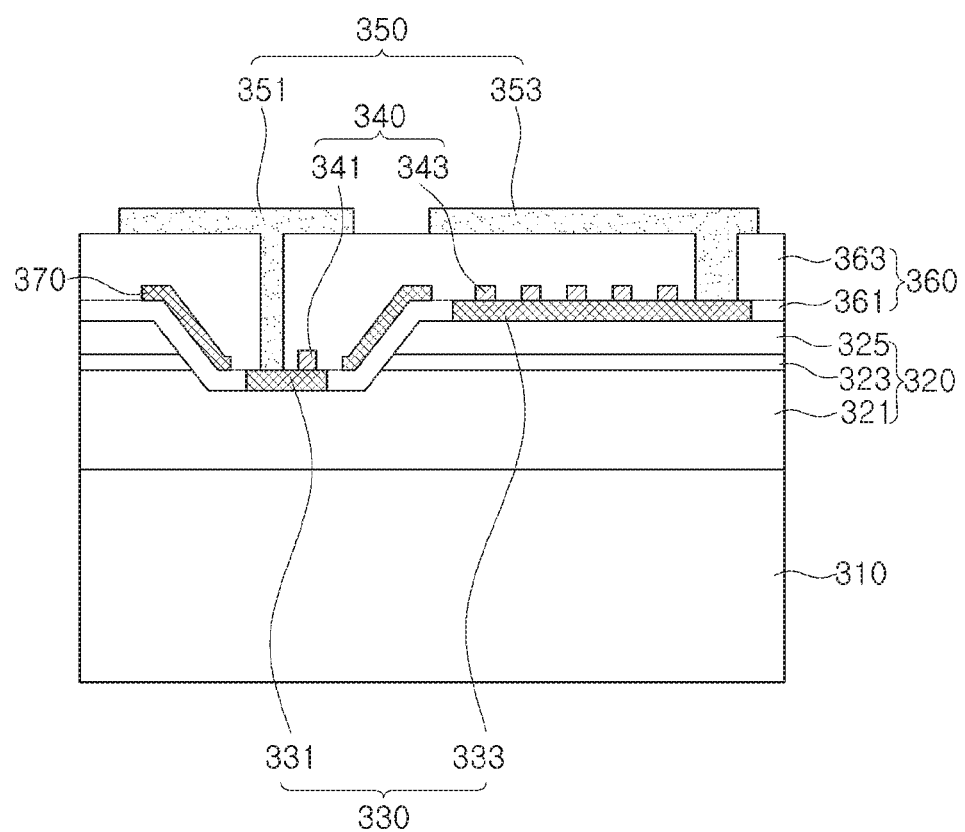

Referring to FIG. 5, a semiconductor light-emitting device 300 according to some example embodiments of the inventive concepts may include a substrate 310, a light-emitting structure 320, a contact electrode 330, a magnetic layer 340, and a pad electrode 350, disposed on the substrate 310. The pad electrode 350 may pass through an insulating layer 360 disposed on a second conductivity-type semiconductor layer 325 to be connected to the contact electrode 330. In order to increase light extraction efficiency in a direction toward the substrate 310, a reflective metal layer 370 may be formed in a trench exposing a first conductivity-type semiconductor layer 321.

The magnetic layer 340 may include first and second magnetic layers 341 and 343, and the first and second magnetic layers 341 and 343 may be respectively disposed on first and second contact electrodes 331 and 333. The second magnetic layer 343 may have a greater area than the first magnetic layer 341, and may have a desired (and/or alternatively predetermined) pattern (e.g., may define a pattern). In some example embodiments, the second magnetic layer 343 may have a line pattern including a plurality of line structures extending in a specific direction, a dot pattern including a plurality of dot structures separated from each other, or the like.

A magnetization direction of the first and second magnetic layers 341 and 343 may cross a direction of currents flowing in the light-emitting structure 320, and may be parallel or substantially parallel to an upper surface of active layer 323. The currents may flow perpendicular to the upper surface of the active layer 323 in the light-emitting structure 320. Accordingly, by disposing the first and second magnetic layers 341 and 343 magnetized in the direction parallel or substantially parallel to the upper surface of the active layer 323, a force in a direction parallel or substantially parallel to an upper surface of the substrate 310 may be applied to electrons and holes in the light-emitting structure 320. The electrons and holes may remain in the active layer 323 for a relatively long time by the force, and the probability of electron-hole recombination may increase, thereby improving the light extraction efficiency.

The first magnetic layer 341 may be disposed on the first contact electrode 331, and may be separated from a first pad electrode 351 by the insulating layer 360. The second magnetic layer 343 may be disposed on the second contact electrode 333 and separated from a second pad electrode 353. Accordingly, currents may not be directly supplied to the first and second magnetic layers 341 and 343. The insulating layer 360 may be disposed between the first and second magnetic layers 341 and 343 and the first and second pad electrodes 351 and 353.

Figure 6:
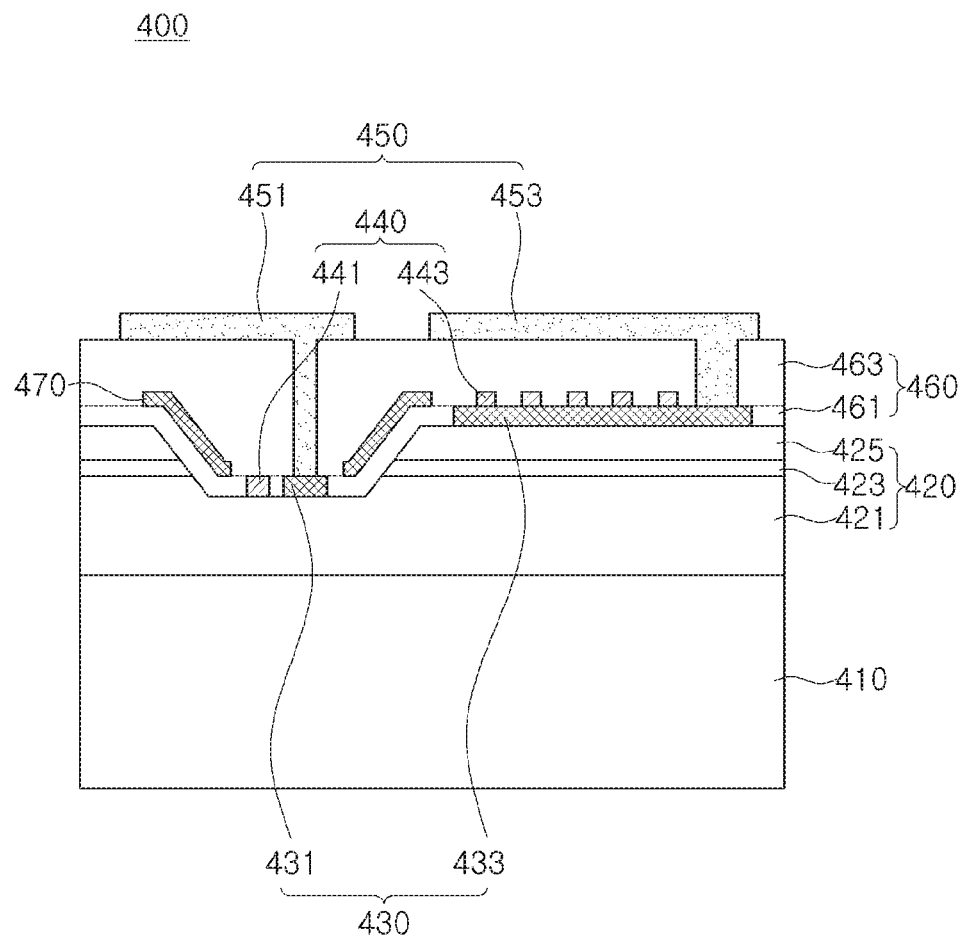

Referring to FIG. 6, a semiconductor light-emitting device 400 according to some example embodiments of the inventive concepts, similar to those according to the example embodiments illustrated in FIGS. 4 and 5, may include a substrate 410, a light-emitting structure 420, a contact electrode 430, a magnetic layer 440, and a pad electrode 450, disposed on the substrate 410. The magnetic layer 440 may include first and second magnetic layers 441 and 443, and the second magnetic layer 443 may have a desired (and/or alternatively predetermined) pattern (e.g., may define a pattern).

In the example embodiments illustrated in FIG. 6, the first magnetic layer 441 may be directly formed on an upper surface of a first conductivity-type semiconductor layer 421. That is, the first magnetic layer 441, similar to the first contact electrode 431, may be formed on the upper surface of the first conductivity-type semiconductor layer 421 exposed in a trench. The first magnetic layer 441 and the first contact electrode 431 may be spaced apart from each other at a certain distance, or the first magnetic layer 441 may be in contact with a side surface of the first contact electrode 431. When the first magnetic layer 441 and the first contact electrode 431 are separated, an insulating layer 461 may be disposed therebetween.

Each magnetization direction of the first magnetic layer 441 and the second magnetic layer 443 may cross a direction of currents flowing through the light-emitting structure 420, and may be parallel or substantially parallel to the upper surface of the substrate 410. By setting the magnetization direction of the first and second magnetic layers 441 and 443 as described above, electrons and holes in the light-emitting structure 420 may receive a force in a direction parallel or substantially parallel to the upper surface of the substrate 410. Accordingly, since the electrons and holes in an active layer 423 receive the force in the direction parallel or substantially parallel to the upper surface of the substrate 410 and remain in the active layer 423 for a relatively long time, the probability of electron-hole recombination may increase, thereby improving the light extraction efficiency.

In the example embodiments illustrated in FIG. 6, the first and second magnetic layers 441 and 443 may be formed in a single process. In a manufacturing process of the semiconductor light-emitting device 400, the light-emitting structure 420 may be formed on the substrate 410, then the light-emitting structure 420 may be partially formed in the trench to partially expose the first conductivity-type semiconductor layer 421, and then the first and second contact electrodes 431 and 433 may be formed. Each of the first and second magnetic layers 441 and 443 may be formed in a single process, and an insulating layer 460 may be formed thereon. The method of forming the first and second magnetic layers 441 and 443 in the single process as described above may be similarly applied to the semiconductor light-emitting devices 200 and 300 according to the example embodiments illustrated in FIGS. 4 and 5.

In the example embodiments illustrated in FIGS. 4 and 5, the first contact electrodes 231 and 331 may be thinner than the second contact electrodes 233 and 333. In addition, in the example embodiments illustrated in FIG. 6, the first magnetic layer 441 may be directly formed on the first conductivity-type semiconductor layer 421, and the second magnetic layer 443 may be disposed on the second contact electrode 433. Accordingly, in the example embodiments illustrated in FIGS. 4 to 6, the first magnetic layers 241, 341, and 441 may be disposed closer to the light-emitting structures 220, 320, and 420 than the second magnetic layers 243, 343, and 443.

Figure 7:
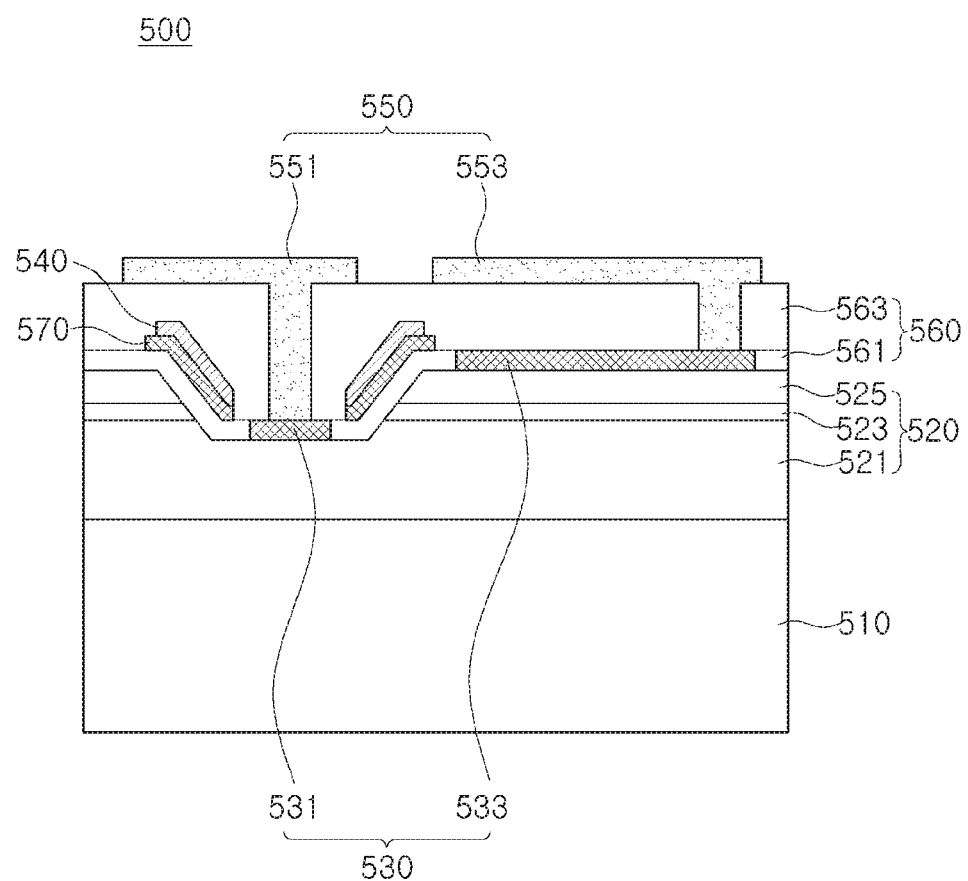

Referring to FIG. 7, a semiconductor light-emitting device 500 according to some example embodiments of the inventive concepts may include a substrate 510, a light-emitting structure 520, a contact electrode 530, and a pad electrode 550, disposed on the substrate 510. The pad electrode 550 may pass through an insulating layer 560 formed on the light-emitting structure 520 to be electrically connected to the contact electrode 530. A reflective metal layer 570 may be formed on a trench formed by partially removing the light-emitting structure 520 and partially exposing a first conductivity-type semiconductor layer 521.

In the example embodiments illustrated in FIG. 7, the semiconductor light-emitting device 500 may include a magnetic layer 540 formed on the reflective metal layer 570 in the trench. A magnetization direction of the magnetic layer 540 may cross a direction of currents flowing in the light-emitting structure 520 and may be parallel or substantially parallel to an upper surface of an active layer 523. The currents may flow in the light-emitting structure 520 in a direction from the second conductivity-type semiconductor layer 525 to the first conductivity-type semiconductor layer 521 via the active layer 523. The magnetization direction of the magnetic layer 540 may be perpendicular to a direction of the currents, and parallel or substantially parallel with an upper surface of the active layer 523.

By a magnetic field provided by the magnetic layer 540, electrons and holes in the light-emitting structure 520 may receive a force in a direction perpendicular to the direction of currents flowing in the light-emitting structure 520. Accordingly, since the electrons and holes remain in the active layer 423 for a relatively long time, the probability of electron-hole recombination in the active layer 523 may increase, thereby improving the light extraction efficiency.

Figure 8:
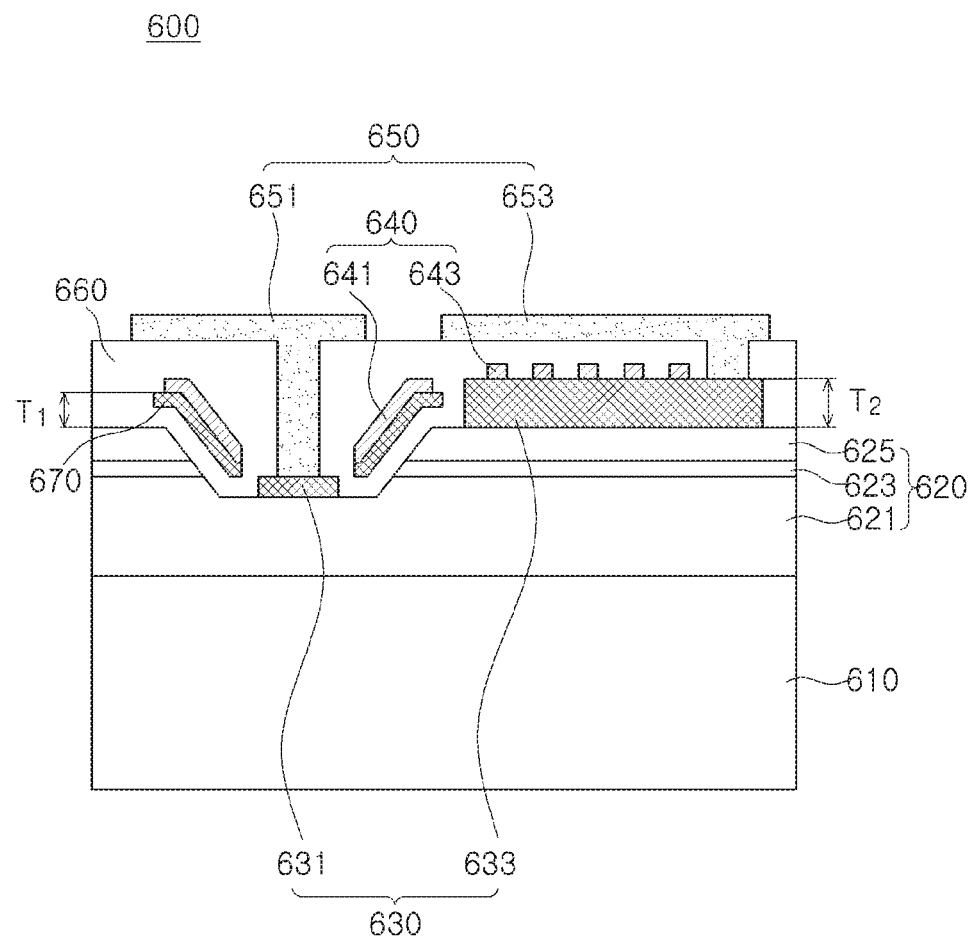

Referring to FIG. 8, a semiconductor light-emitting device 600 according to some example embodiments of the inventive concepts may include a substrate 610, a light-emitting structure 620, a contact electrode 630, a magnetic layer 640, and a pad electrode 650. The magnetic layer 640 in the semiconductor light-emitting device 600 according to the example embodiments illustrated in FIG. 8 may include a first magnetic layer 641 formed on a reflective metal layer 670 in a trench, and a second magnetic layer 643 formed on a second contact electrode 633.

The second magnetic layer 643 may be formed adjacent to a second conductivity-type semiconductor layer 625 on the second contact electrode 633, and may have a desired (and/or alternatively predetermined) pattern (e.g., may define a pattern). In some example embodiments, the magnetic layer 643 may have a line pattern including a plurality of line structures extending in a specific direction, a dot pattern including a plurality of dot structures separated from each other, or the like.

The first magnetic layer 641 may be formed on at least a portion of an upper surface of the reflective metal layer 670. Although the first magnetic layer 641 is illustrated as having a similar shape to the reflective metal layer 670, the first magnetic layer 641, like the second magnetic layer 643, may have a desired (and/or alternatively predetermined) pattern (e.g., may define a pattern).

In the example embodiments illustrated in FIG. 8, a distance $T_1$ ("first distance") between the first magnetic layer 641 and the light-emitting structure 620 may be smaller than a distance $T_2$ ("second distance") between the second magnetic layer 643 and the light-emitting structure 620. That is, a distance between the first magnetic layer 641 and the first conductivity-type semiconductor layer 621 or the active layer 623 may be smaller than a distance between the second magnetic layer 643 and the second conductivity-type semiconductor layer 625. The distance between the first magnetic layer 641 and the first conductivity-type semiconductor layer 621 or the active layer 623 may be referred to as a first distance between the first magnetic layer 641 and the first conductivity-type semiconductor layer 621 or the active layer 623. The distance between the second magnetic layer 643 and the second conductivity-type semiconductor layer 625 may be referred to as a second distance between the second magnetic layer 643 and the second conductivity-type semiconductor layer 625. Accordingly, which layer of the light-emitting structure 620 is disposed closest to the magnetic layer 640 may not be specified. In the example embodiments illustrated in FIG. 8, the second contact electrode 633 may be intentionally formed to be thicker than the reflective metal layer 670, such that a first thickness of the first contact electrode 631 is smaller than a second thickness of the second contact electrode 633.

Figure 9:
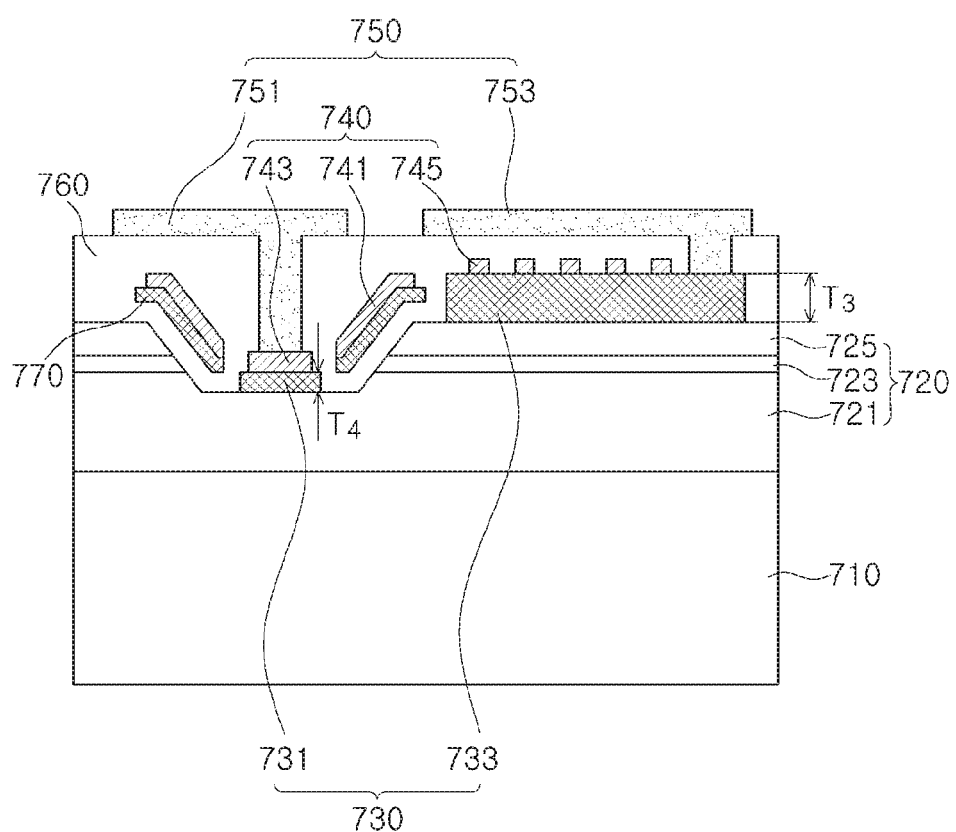

Referring to FIG. 9, a semiconductor light-emitting device 700 may include a substrate 710, a light-emitting structure 720, a contact electrode 730, a magnetic layer 740, and a pad electrode 750. In the semiconductor light-emitting device 700 according to the example embodiments illustrated in FIG. 9, the magnetic layer 740 may include a first magnetic layer 741 and second magnetic layers 743 and 745.

In the example embodiments illustrated in FIG. 9, the second magnetic layers 743 and 745 may be formed adjacent to a first contact electrode 731 and a second contact electrode 733, respectively. The second magnetic layer 743 formed adjacent to the first contact electrode 731 may be formed on an upper surface of the first contact electrode 731 as illustrated in FIG. 9, or on a side surface of the first contact electrode 731. Shapes, patterns, or the number of the second magnetic layers 743 and 745 may be variously changed.

A distance $T_3$ between the second magnetic layers 743 and 745 and a second conductivity-type semiconductor layer 725 may be greater than a distance $T_4$ between the second magnetic layers 743 and 745 and a first conductivity-type semiconductor layer 721. That is, the second magnetic layers 743 and 745 may be disposed closer to the first conductivity-type semiconductor layer 721 than to the second conductivity-type semiconductor layer 725. The distance $T_4$ between the second magnetic layers 743 and the first conductivity-type semiconductor layer 721 may be smaller than a distance between the first magnetic layer 741 and the light-emitting structure 720, and thus the first conductivity-type semiconductor layer 721 may be disposed closest to the magnetic layer 740.

Figure 10:
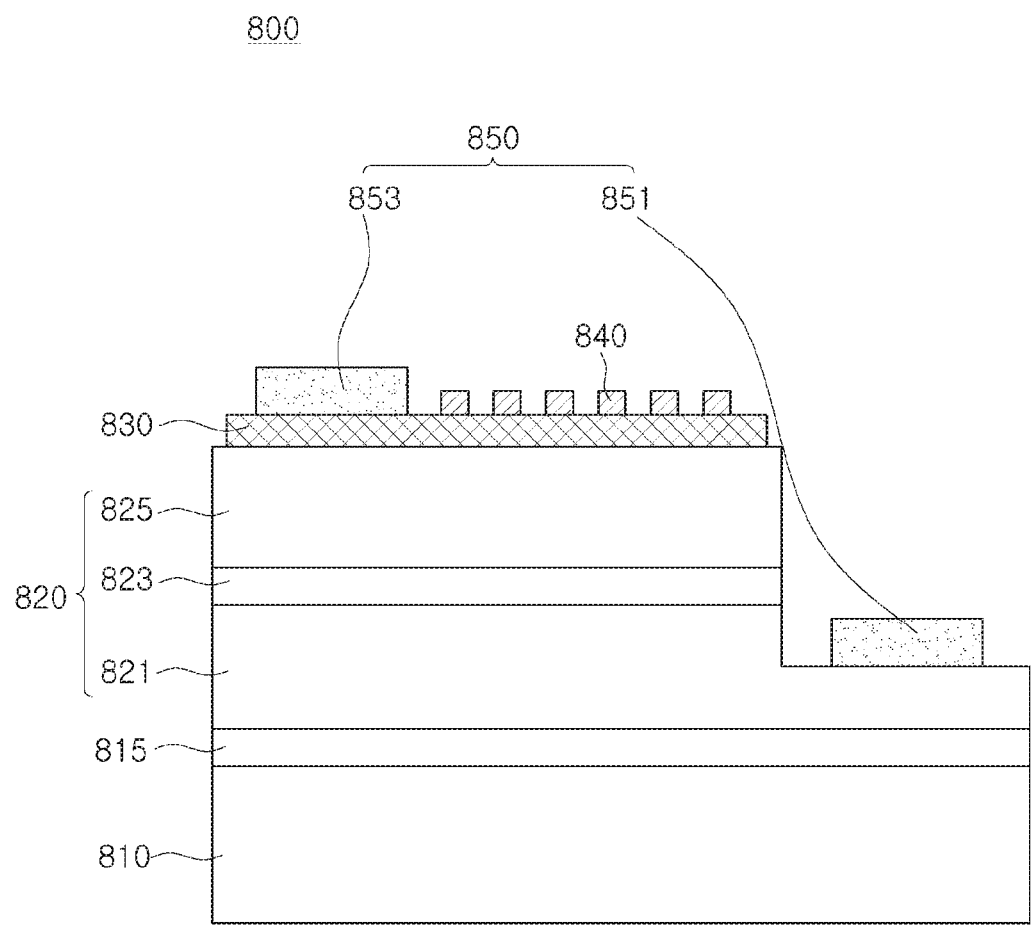

Referring to FIG. 10, a semiconductor light-emitting device 800 according to some example embodiments of the inventive concepts may include a substrate 810, a buffer layer 815, a light-emitting structure 820, a contact electrode 830, a magnetic layer 840, and a pad electrode 850. In the example embodiments illustrated in FIG. 10, the semiconductor light-emitting device 800 may have an Epi-Up structure.

The substrate 810 may be an insulating substrate such as sapphire, or may be a conductive or semiconductive substrate. The buffer layer 815 may have a composition of $In_xAl_yGa_{1-x-y}N$ ($0 \leq x \leq 1$ and $0 \leq y \leq 1$). In some example embodiments, the buffer layer 815 may be GaN, AlN, AlGaN, or InGaN. As needed, the buffer layer may be formed by combining a plurality of layers or may have a gradated composition. The buffer layer 815 may be provided to reduce and/or prevent cracking due to a difference in lattice constants between the substrate 810 and the light-emitting structure 820.

Compositions and characteristics of first and second conductivity-type semiconductor layers 821 and 825 and an active layer 823 included in the light-emitting structure 820 may be similar to those described with reference to FIGS. 1 to 8. That is, the first and second conductivity-type semiconductor layers 821 and 825 may include a nitride semiconductor satisfying $In_xAl_yGa_{1-x-y}N$ ($0 \leq x < 1$, $0 \leq y < 1$, and $0 \leq x+y < 1$), and may be doped with different impurities from each other. For example, the first conductivity-type semiconductor layer 821 may be doped with n-type impurities such as Si, and the second conductivity-type semiconductor layer 825 may be doped with p-type impurities such as Mg or Zn. The active layer 823 may have an MQW or SQW structure, and may have a structure in which a quantum well layer and a quantum barrier layer are stacked. In some example embodiments, the quantum well layer may be $In_xGa_{1-x}N$ ($0 < x \leq 1$), and the quantum barrier layer may be GaN or AlGaN.

The contact electrode 830 may be formed on the second conductivity-type semiconductor layer 825. In the example embodiments illustrated in FIG. 10, the contact electrode 830 may be formed of a different material depending on a method of mounting the semiconductor light-emitting device 800. When the semiconductor light-emitting device 800 is mounted in a flip-chip method, the contact electrode 830 may be formed of a metal having a relatively high reflectance. If and/or when the semiconductor light-emitting device 800 is mounted using a wire, the contact electrode 830 may be formed of a material having a relatively high transmittance. The first and second pad electrodes 851 and 853 may be formed of a metal such as Au, Ni, Sn, Ti, Al, or Cr.

Further, the magnetic layer 840 may be formed on an upper surface of the contact electrode 830. The magnetic layer 840 may include a plurality of structures arranged in a specific pattern (e.g., a plurality of structures that at least partially define a specific pattern) (e.g., defining a pattern). A magnetic field having a magnetization direction crossing a direction of currents flowing in the light-emitting structure 820 and parallel or substantially parallel to the upper surface of the active layer 823 may be provided. By the magnetic field provided by the magnetic layer 840, electrons and holes combining in the active layer 823 of the light-emitting structure 820 may receive a force in a direction parallel or substantially parallel to the upper surface of the active layer 823, and may remain in the active layer 823 for a relatively long time. Accordingly, efficiency of electron-hole recombination may be improved, and light extraction efficiency may be increased.

Figure 11A:
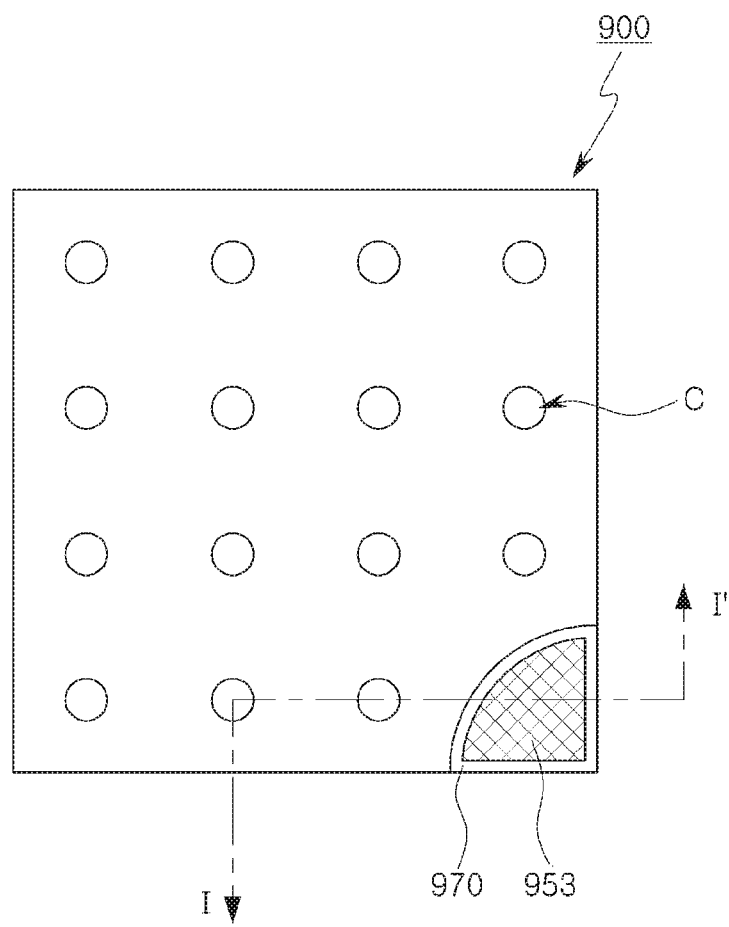
FIG. 11A is a plan view illustrating a semiconductor light-emitting device according to some example embodiments of the inventive concepts.
Figure 11B:
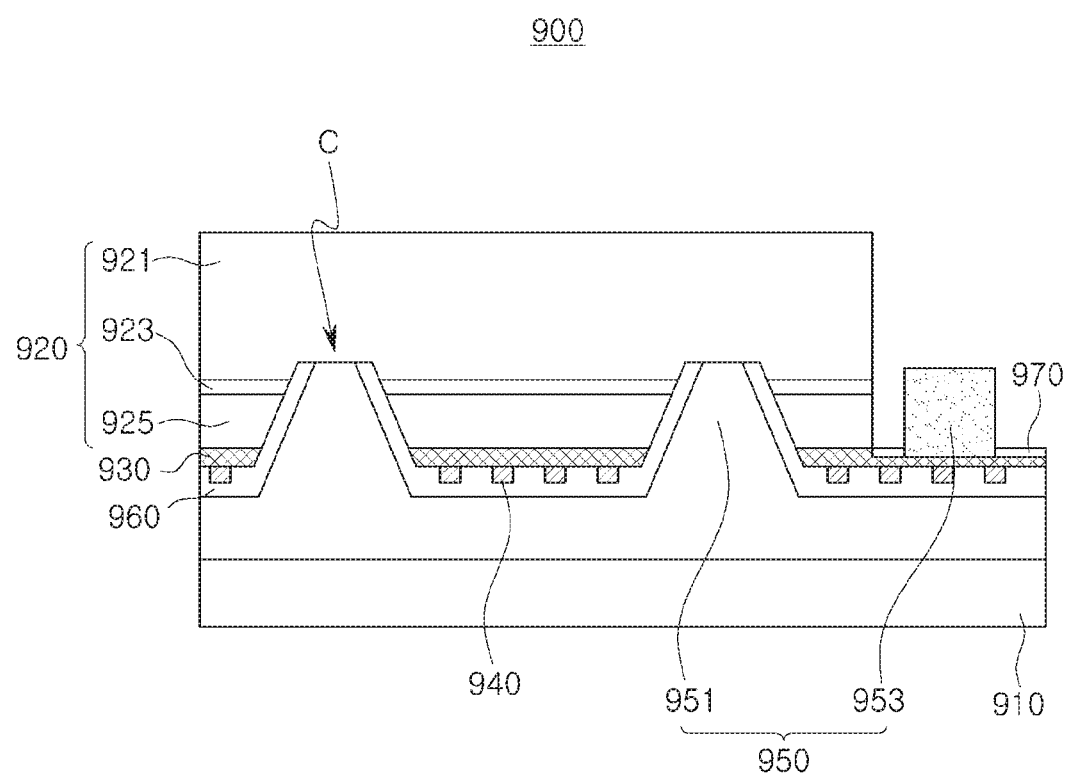
FIG. 11B is a cross-sectional view taken along line I-I' of the semiconductor light-emitting device illustrated in FIG. 11A.

FIG. 11A is a plan view illustrating a semiconductor light-emitting device according to some example embodiments of the inventive concepts, and FIG. 11B is a cross-sectional view taken along line I-I' of the semiconductor light-emitting device illustrated in FIG. 11A.

Referring to FIGS. 11A and 11B, a semiconductor light-emitting device 900 according to the example embodiment may include a substrate 910, a light-emitting structure 920, a contact electrode 930, a first electrode 951, a second electrode 953, an insulating layer 960, and a magnetic layer 940. The light-emitting structure 920 may include a first conductivity-type semiconductor layer 921, an active layer 923, and a second conductivity-type semiconductor layer 925, disposed on a substrate 910. The substrate 910 may be a conductive substrate.

The first electrode 951 may include one or more conductive vias C electrically isolated from the second conductivity-type semiconductor layer 925 and the active layer 923 and extending to at least a portion of the first conductivity-type semiconductor layer 921, so as to be electrically connected to the first conductivity-type semiconductor layer 921. The conductive vias C may extend from an interface with the first electrode 951 to an inside of the first conductivity-type semiconductor layer 921 via the contact electrode 930, the second conductivity-type semiconductor layer 925, and the active layer 923. Such conductive vias C may be formed in an etching process such as ICP-RIE (Inductively Coupled Plasma-Reactive Ion Etching).

The insulating layer 960 electrically isolating the first electrode 951 from the other elements except the substrate 910 and the first conductivity-type semiconductor layer 921 may be formed on the first electrode 951. As illustrated in FIG. 11B, the insulating layer 960 may be formed on side surfaces of the conductive vias C as well as between the contact electrode 930 and the first electrode 951. Therefore, the first electrode 951 may be isolated from the contact electrode 930, the second conductivity-type semiconductor layer 925, and the active layer 923, exposed on the side surfaces of the conductive vias C. The insulating layer 960 may be formed by depositing an insulating material such as $SiO_2$, $SiO_xN_y$, or $Si_xN_y$.

A portion of the first electrode 951 may be connected to the first conductivity-type semiconductor layer 921 by the conductive vias C. A lower surface of the first electrode 951 may be connected to the conductive substrate 910, and an electrical signal may be applied to the first conductivity-type semiconductor layer 921 via the substrate 910 and the first electrode 951.

The number, shape, and pitch of the conductive vias C and contact diameters (or contact areas) between the conductive vias C and the first and second conductivity-type semiconductor layers 921 and 925 may be properly adjusted (please refer to FIG. 11A) in order to decrease a contact resistance, and the conductive vias C may be arranged in rows and columns in various forms in order to improve current flow in the semiconductor light-emitting device 900. In some example embodiments, the number and the area of the conductive vias C may be controlled in such a manner that a contact area between the first conductivity-type semiconductor layer 921 and the first electrode 951 is in a range of 0.1% to 20% of an average area of the light-emitting structure 920.

The contact electrode 930 may extend externally from the light-emitting structure 920 to be partially exposed as illustrated in FIG. 11B, and thus may be connected to the second electrode 953. External power may be supplied to the contact electrode 930 via the second electrode 953. Although the number of the second electrode 953 is illustrated as one in the example embodiments illustrated in FIGS. 11A and 11B, a plurality of second electrodes 953 may be included as needed. The second electrode 953 may be formed on a corner of the semiconductor light-emitting device 900 as illustrated in FIG. 11A in order to increase (and/or maximize) a light-emitting area.

An etch-stop insulating layer 970 may be formed around the second electrode 953. The etch-stop insulating layer 970 may be formed after the light-emitting structure 920 is formed and before the contact electrode 930 is formed, and may function as an etch stop layer during an etching process for forming the second electrode 953.

The contact electrode 930 may form ohmic contact with the second conductivity-type semiconductor layer 925 and include a material having a relatively high reflectance. For example, the contact electrode 930 may include Ag, Al, Ni, Cr, Cu, Au, Pd, Pt, Sn, W, Rh, Ir, Ru, Mg, Zn, or an alloy thereof.

Referring to FIG. 11B, the magnetic layer 940 may be formed in the insulating layer 960. The magnetic layer 940 may include a plurality of structures having a desired (and/or alternatively predetermined) pattern (e.g., defining a pattern), and may be formed on the contact electrode 930. The plurality of structures included in the magnetic layer 940 may provide a magnetic field having the same or different magnetization directions, and a direction of a magnetic field provided by the magnetic layer 940 may be parallel or substantially parallel to the upper surface of the active layer 923. That is, in the example embodiments illustrated in FIG. 11B, a magnetic field parallel or substantially parallel to an x-z plane may be provided by the magnetic layer 940.

That is, the direction of a magnetic field provided by the magnetic layer 940 may cross a direction of currents flowing in the light-emitting structure 920. Accordingly, electrons and holes existing in the active layer 923 may receive a force parallel or substantially parallel to an upper surface of the active layer 923 by the magnetic field provided by the magnetic layer 940 and thus remain in the active layer 923 for a relatively long time. Accordingly, the light extraction efficiency may be improved.

Figure 12:
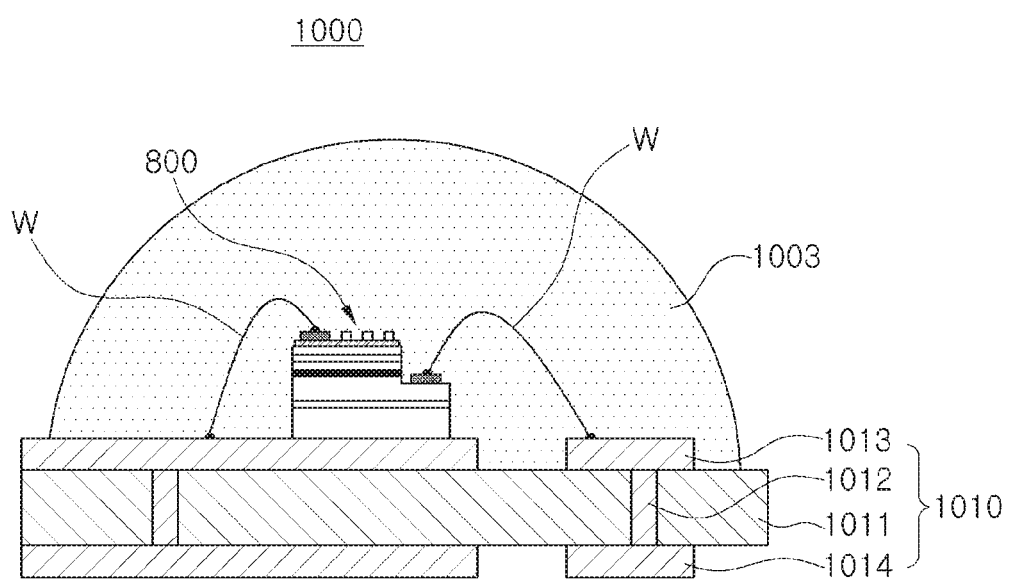
FIGS. 12 and 13 illustrate a semiconductor light-emitting device package including a semiconductor light-emitting device according to some example embodiments of the inventive concepts.
Figure 13:
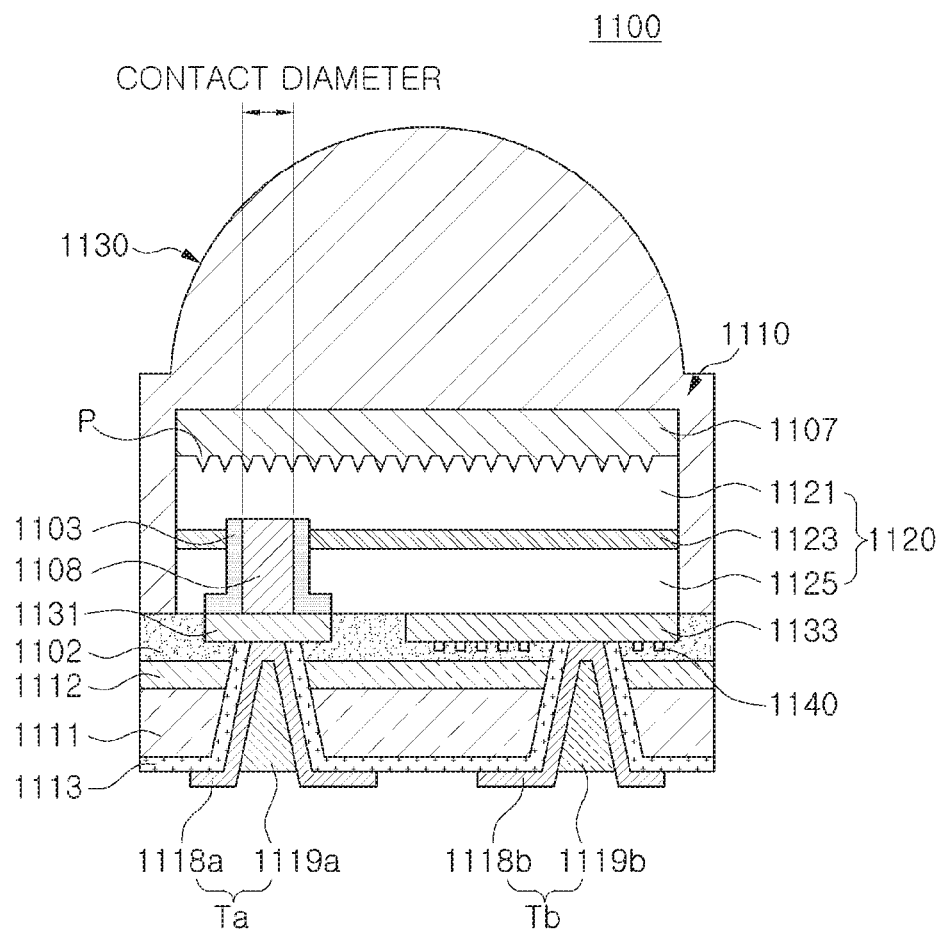

FIGS. 12 and 13 illustrate a semiconductor light-emitting device package including a semiconductor light-emitting device according to some example embodiments of the inventive concepts.

First, referring to FIG. 12, a light-emitting device package 1000 according to the example embodiment may include a semiconductor light-emitting device 800, a mounting board 1010, and an encapsulant 1003. Although the light-emitting device package 1000 according to the example embodiments illustrated in FIG. 12 is illustrated as including the semiconductor light-emitting device 800 according to the example embodiments illustrated in FIG. 10, it may include another semiconductor light-emitting device 100, 200, 300, 400, 500, 600, 700, or 900 according to other example embodiments.

The semiconductor light-emitting device 800 may be mounted on the mounting board 1010, and may be electrically connected to the mounting board 1010 through a wire W. The mounting board 1010 may include a substrate body 1011, an upper electrode 1013, a lower electrode 1014, and a through electrode 1012 connecting the upper electrode 1013 to the lower electrode 1014. The substrate body 1011 of the mounting board 1010 may be a resin, a ceramic, or a metal, and the upper and lower electrodes 1013 and 1014 may include a metal such as Au, Cu, Ag, or Al. For example, the mounting board 1010 may be provided as a printed circuit board (PCB), a metal core PCB (MCPCB), a metal PCB (MPCB), a flexible PCB (FPCB), or the like, and a structure of the mounting board 1010 may be applied in various forms.

The encapsulant 1003 may be formed to have a dome-shaped lens structure having a convex upper surface. In some embodiments, the encapsulant 1003 may have a convex or concave lens structure to adjust an orientation angle of light emitted through the upper surface of the encapsulant 1003.

Referring to FIG. 13, a light-emitting device package 1100 may include a semiconductor light-emitting device 1110, first and second terminals Ta and Tb electrically connected to the semiconductor light-emitting device 1110, a fluorescent substance 1107, and a lens 1130. In the light-emitting device package 1100 according to the example embodiments illustrated in FIG. 13, an electrode is formed through a lower surface of the light-emitting device 1110 opposed to a main light extracting surface, and the fluorescent substance 1107 and the lens 1130 may be integrated.

The semiconductor light-emitting device 1110 may include a light-emitting structure 1120. The light-emitting structure 1120 may have a stacked structure including first and second conductivity-type semiconductor layers 1121 and 1125 and an active layer 1123 interposed therebetween. In the example embodiments illustrated in FIG. 13, the first and second conductivity-type semiconductor layers 1121 and 1125 may be n-type and p-type semiconductor layers, respectively. In addition, the first and second conductivity-type semiconductor layers 1121 and 1125 may have a composition of a nitride semiconductor, such as $Al_xIn_yGa_{(1-x-y)}N$ ($0 \leq x<1$, $0 \leq y<1$, and $0 \leq x+y<1$). Besides the nitride semiconductor, a GaAs-based semiconductor or a GaP-based semiconductor may be used.

The active layer 1123 interposed between the first and second conductivity-type semiconductor layers 1121 and 1125 may emit light having desired (and/or alternatively predetermined) energy, generated by electron-hole recombination, and may have an MQW structure in which quantum well layers and quantum barrier layers are alternately stacked. When the active layer 213 has the MQW structure, it may have an InGaN/GaN or AlGaN/GaN structure.

A growth substrate has been removed from the semiconductor light-emitting device 1110, and a surface from which the growth substrate has been removed may include embossings P. In addition, the fluorescent substance 1107 may be formed as a light conversion layer on the surface including the embossings P. In some example embodiments, the growth substrate may not be removed, and the embossings P and the fluorescent substance 1107 may be formed on a back surface of the growth substrate. The semiconductor light-emitting device 1110 may include first and second contact electrodes 1131 and 1133 respectively connected to the first and second conductivity-type semiconductor layers 1121 and 1125. The first contact electrode 1131 may include a conductive via 1108 passing through the second conductivity-type semiconductor layer 1125 and the active layer 1123 to be connected to the first conductivity-type semiconductor layer 1121. An insulating layer 1103 may be formed between the conductive via 1108 and the active layer 1123 and second conductivity-type semiconductor layer 1125 to reduce and/or prevent electrical short circuits.

Although the number of the conductive via 1108 is illustrated as one, two or more conductive vias 1108 may be arranged in various forms for current distribution. The arrangement of the conductive via 1108 may be similar to that in the example embodiments illustrated in FIGS. 11A and 11B.

A mounting board 1111 employed in the example embodiment may be a support substrate such as a silicon substrate to which a semiconductor process is easily applied, but is not limited thereto. The mounting board 1111 and the semiconductor light-emitting device 1110 may be bonded by first and second bonding layers 1102 and 1112. The first and second bonding layers 1102 and 1112 may be formed of an electrically insulating material or an electrically conductive material. For example, the electrically insulating material may be an oxide such as $SiO_2$ or SiN, or a resin such as a silicon resin or an epoxy resin, and the electrically conductive material may be Ag, Al, Ti, W, Cu, Sn, Ni, Pt, Cr, NiSn, TiW, AuSn, or a eutectic metal thereof. The first bonding layer 1102 may include the electrically insulating material so as to reduce and/or prevent the first and second contact electrodes 1131 and 1133 from being electrically connected to each other.

The first and second contact electrodes 1131 and 1133 may be connected to the first and second terminals Ta and Tb. The first and second terminals Ta and Tb may respectively include first metal layers 1118a and 1118b provided as seed layers, and second metal layers 1119a and 1119b formed in an electroplating process using the first metal layers 1118a and 1118b as seed layers. The first and second terminals Ta and Tb may pass through the first and second bonding layers 1102 and 1112 and the mounting board 1111 to be connected to the first and second contact electrodes 1131 and 1133, and may be electrically isolated from the first and second bonding layers 1102 and 1112 and the mounting board 1111 by an insulating layer 1113.

In the example embodiments illustrated in FIG. 13, a magnetic layer 1140 may be formed on the second contact electrode 1133. A direction of a magnetic field provided by the magnetic layer 1140 may cross a direction of currents flowing in the light-emitting structure 1120. By the magnetic field provided by the magnetic layer 1140, electrons and holes existing in the light-emitting structure 1120 may receive a force parallel or substantially parallel to an upper surface of the active layer 1123 by the magnetic field provided by the magnetic layer 940 and thus stay for a relatively long time in the active layer 1123. Accordingly, the probability of electron-hole recombination in the active layer 1123 may increase, thereby improving the light extraction efficiency.

Figure 14A:
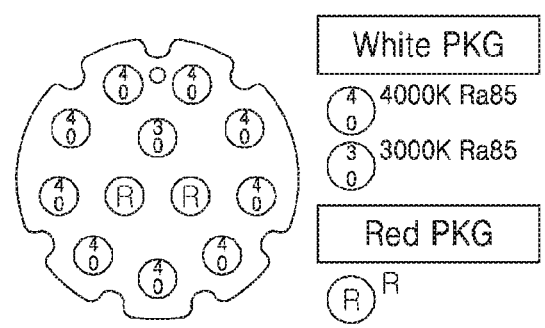
FIGS. 14A and 14B are schematic diagrams illustrating white light source modules applicable to a lighting apparatus according to some example embodiments of the inventive concepts.
Figure 14B:
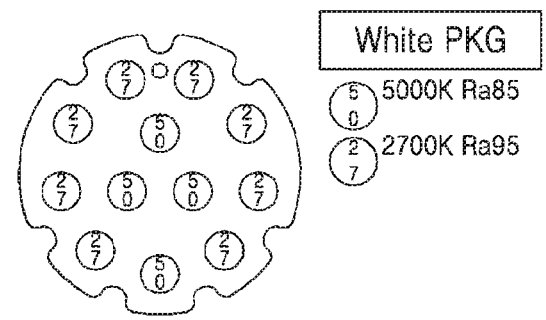
Figure 15:
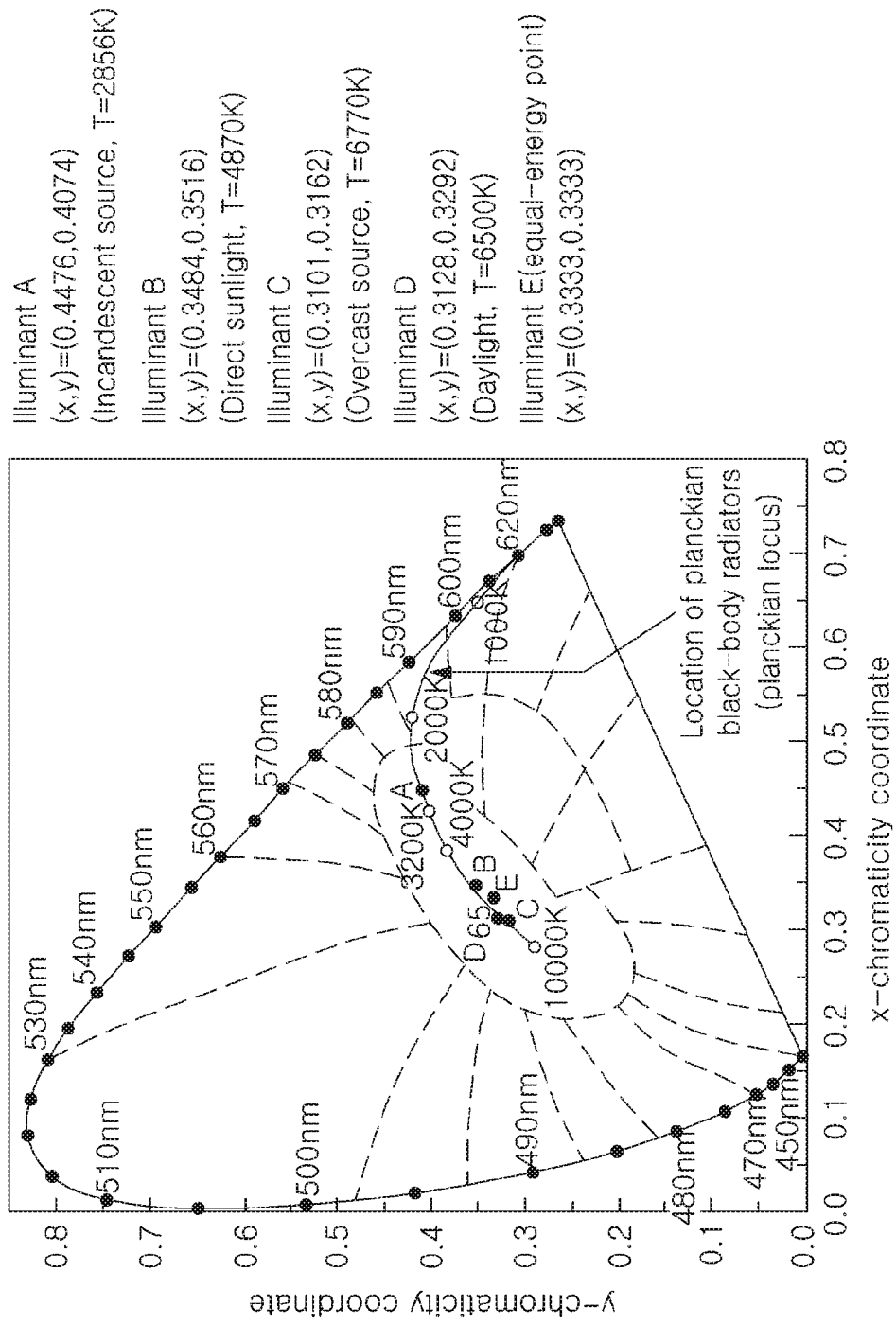
FIG. 15 is a CIE 1931 color space chromaticity diagram provided to illustrate an operation of the white light source modules illustrated in FIGS. 14A and 14B.

FIGS. 14A and 14B are schematic diagrams illustrating white light source modules applicable to a lighting apparatus according to some example embodiments of the inventive concepts. FIG. 15 is a CIE 1931 color space chromaticity diagram provided to illustrate an operation of the white light source modules illustrated in FIGS. 14A and 14B.

The white light source modules illustrated in FIGS. 14A and 14B may include a plurality of light-emitting device packages, each of which is mounted on a circuit board. The plurality of light-emitting device packages mounted on a single white light source module may be configured with the same type of packages generating light of the same wavelength, or may be configured with different types of packages generating light of different wavelengths as illustrated in the example embodiment of the present invented concept.

Referring to FIG. 14A, the white light source module may be formed by combining white light-emitting device packages ('30' and '40') having color temperatures of 4,000 K and 3,000 K and a red light-emitting device package ('R'). The white light source module may provide white light having a color temperature controlled within the range of 3,000 K to 4,000 K and a color rendering index Ra in the range of 95 to 100.

In other example embodiments, the white light source module may be formed only with the white light-emitting device packages, but some of the white light-emitting device packages may emit white light having a different color temperature. For example, as illustrated in FIG. 14B, by combining a white light-emitting device package ('27') having a color temperature of 2,700 K and a white light-emitting device package ('50') having a color temperature of 5,000 K, white light having a color temperature controlled in the range of 2,700 K to 5,000 K and a color rendering index Ra in the range of 85 to 99 may be provided. Here, the number of light-emitting device packages having a certain color temperature may be changed, mainly depending on a set value of a default color temperature. For example, when a set value of a default color temperature of a lighting apparatus is about 4,000 K, the number of light-emitting device packages corresponding to the color temperature of 4,000 K may be greater than the number of light-emitting device packages corresponding to a color temperature of 3,000 K or the number of the red light-emitting device packages.

In this manner, the color temperature and the color rendering index (hereinafter, CRI) of white light may be controlled by configuring a heterogeneous light-emitting device package to include a light-emitting device emitting white light by combining a yellow, green, red, or orange fluorescent substance with a blue light-emitting device, and at least one of violet, blue, green, red, and infrared light-emitting devices. The above-described white light-emitting module may be applied as a light source to various types of lighting apparatuses.

In a single light-emitting device package, light of a preferred color may be determined according to a wavelength of an LED chip, that is, the light-emitting device, and a type and mixing ratio of the fluorescent substance. In addition, a color temperature and CRI of white light may be controlled.

For example, when an LED chip emits blue light, a light-emitting device package including at least one of yellow, green, and red fluorescent substances may emit white light having a variety of color temperatures depending on a mixing ratio of the fluorescent substance. Alternatively, a light-emitting device package including a blue LED chip and a green or red fluorescent substance may emit green or red light. In this manner, a color temperature and CRI of white light may be controlled by combining a light-emitting device package emitting white light and a light-emitting device package emitting green or red light. In addition, the light-emitting device package may be configured to include at least one light-emitting device emitting violet, blue, green, red, or infrared light.

In such a case, the lighting apparatus may be controlled to have CRI in the range from a level of a sodium (Na) lamp to a level of sunlight, and may generate white light having a various color temperatures in a range of 1,500K to 20,000K. In addition, since the lighting apparatus emits visible light having a violet, blue, green, red, or orange color, or infrared light, as needed, the color of the lighting apparatus may be controlled according to an environment or mood. In addition, the lighting apparatus may emit light having a specific wavelength to promote plant growth.

White light formed by a combination of a blue LED and yellow, green, and red fluorescent substances and/or green and red LEDs may have two or more peak wavelengths, and may be located on the line connecting (x, y) coordinates of (0.4476, 0.4074), (0.3484, 0.3516), (0.3101, 0.3162), (0.3128, 0.3292), (0.3333, 0.3333) in the CIE 1931 color space chromaticity diagram, as illustrated in FIG. 15. In addition, the white light may be located in a zone surrounded by the line and a blackbody radiation spectrum. The color temperature of the white light may correspond to 2,000 K to 20,000 K. In FIG. 15, white light around the coordinates E (0.3333, 0.3333) located below the blackbody radiation spectrum may be light in which light of a yellow-based component is relatively weak, and may be used as light sources of illuminations giving a more vivid or fresh feeling to the naked eye. Accordingly, illumination products using white light around the coordinates E (0.3333, 0.3333) located below the blackbody radiation spectrum may be usefully applied as lightings for shops that sell groceries, clothing, or the like.

Figure 16:
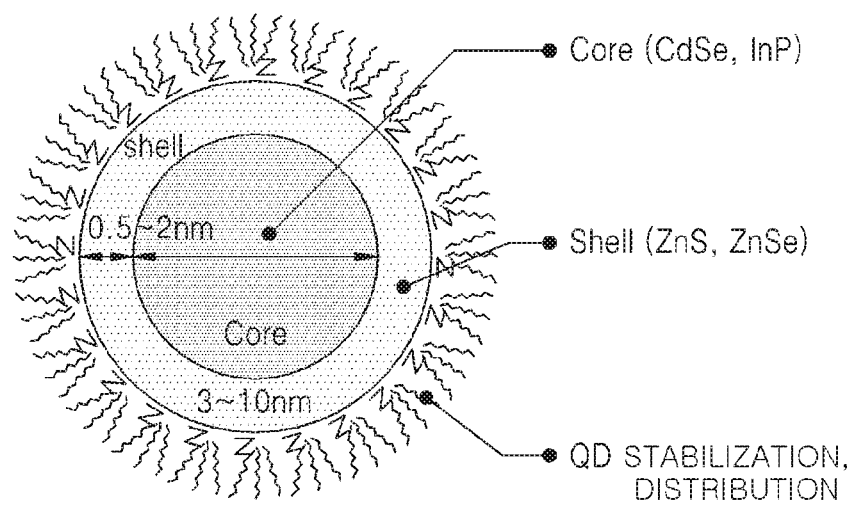
FIG. 16 is a view illustrating a wavelength conversion material applicable to a light source of a lighting apparatus according to some example embodiments of the inventive concepts.

FIG. 16 is a view illustrating a wavelength conversion material applicable to a light source of a lighting apparatus according to some example embodiments of the inventive concepts.

The wavelength conversion material is a material for converting a wavelength of light emitted from a light-emitting device, and various materials such as fluorescent substances and/or quantum dots, may be used.

In some example embodiments, the fluorescent substances used as the wavelength conversion material may have compositional formulas and colors as follows:

> Oxide group: yellow and green $Y_3Al_5O_{12}$:Ce, $Tb_3Al_5O_{12}$:Ce, $Lu_3Al_5O_{12}$:Ce;
>
> Silicate group: yellow and green$(Ba,Sr)_2SiO_4$:Eu, yellow and orange$(Ba,Sr)_3SiO_5$:Ce;
>
> Nitride group: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, SrLiAl$_3$N$_4$:Eu, Ln$_{4-x}$(Eu$_z$M$_{1-z}$)$_x$Si$_{12-y}$Al$_y$
O$_{3+x+y}$N$_{18-x-y}$(0.5≤x≤3, 0<z<0.3, and 0<y≤4)    Formula (1);

(In Formula (1), Ln is at least one element selected from the group consisting of a Group IIIa element and a rare earth element, and M is at least one element selected from the group consisting of Ca, Ba, Sr, and Mg); and Fluoride group: KSF-based red K$_2$SiF$_6$:Mn$_4$+, K$_2$TiF$_6$:Mn$_4^+$, NaYF$_4$:Mn$_4^+$, NaGdF$_4$:Mn$_4^+$(For example, the compositional ratio of Mn may be 0<z<=0.17).

The composition of the fluorescent substance may be consistent with stoichiometry, and each element may be substituted with another element within a corresponding group on the periodic table. For example, strontium (Sr) may be substituted with Ba, Ca, Mg, or the like in the alkaline earth (II) group, and Y may be substituted with Tb, Lu, Sc, Gd, or the like in the lanthanide group. In addition, Eu, an activator, may be substituted with Ce, Tb, Pr, Er, Yb, or the like according to a preferred energy level. The activator may be used alone, or a coactivator may be further included in order to change characteristics.

In particular, each fluoride-based red fluorescent substance may be coated with a fluoride without containing Mn, or a surface of the red fluorescent substance or a surface of the fluoride without containing Mn may be further coated with an organic material in order to improve reliability in a relatively high temperature/high humidity environments. Unlike the other fluorescent substances, such a fluoride-based red fluorescent substance may implement a narrow full width at half maximum (FWHM) of 40 nm or less, and therefore may be used in a high-definition TV such as a UHD TV.

Table 1 below illustrates various types of fluorescent materials in a white light-emitting device package using a blue LED chip having a dominant wavelength in the range of 440 nm to 460 nm or a UV LED chip having a dominant wavelength in the range of 380 nm to 440 nm, listed by applications.

TABLE 1

| Purpose | Fluorescent Substance |
| --- | --- |
| LED TV BLU | β-SiAlON:Eu$^{2+}$, |
|  | (Ca, Sr) AlSiN$_3$:Eu$^{2+}$ |
|  | La$_3$Si$_6$N$_{11}$:Ce$^{3+}$ |
|  | K$_2$SiF$_6$:Mn$^{4+}$ |
|  | SrLiAl$_3$N$_4$:Eu |
|  | Ln$_{4-x}$ (Eu$_z$M$_{1-z}$) $_x$Si$_{12-y}$Al$_y$O$_{3+x+y}$N$_{18-x-y}$ |
|  | (0.5 ≤ x ≤ 3, 0 < z < 0.3, and 0 < y ≤ 4) |
|  | K$_2$TiF$_6$:Mn$^{4+}$ |
|  | NaYF$_4$:Mn$^{4+}$ |
|  | NaGdF$_4$:Mn$^{4+}$ |
| Lighting | Lu$_3$Al$_5$O$_{12}$:Ce$^{3+}$ |
| Apparatuses | Ca-α-SiAlON:Eu$^{2+}$ |
|  | La$_3$Si$_6$N$_{11}$:Ce$^{3+}$ |
|  | (Ca, Sr) AlSiN$_3$:Eu$^{2+}$ |
|  | Y$_3$Al$_5$O$_{12}$:Ce$^{3+}$ |
|  | K$_2$SiF$_6$:Mn$^{4+}$ |
|  | SrLiAl$_3$N$_4$:Eu |
|  | Ln$_{4-x}$ (Eu$_z$M$_{1-z}$) $_x$Si$_{12-y}$Al$_y$O$_{3+x+y}$N$_{18-x-y}$ |
|  | (0.5 ≤ x ≤ 3, 0 < z < 0.3, and 0 < y ≤ 4) |
|  | K$_2$TiF$_6$:Mn$^{4+}$ |
|  | NaYF$_4$:Mn$^{4+}$ |
|  | NaGdF$_4$:Mn$^{4+}$ |
| Side Viewing | Lu$_3$Al$_5$O$_{12}$:Ce$^{3+}$ |
| (Mobile, | Ca-α-SiAlON:Eu$^{2+}$ |
| Laptop PCs) | La$_3$Si$_6$N$_{11}$:Ce$^{3+}$ |
|  | (Ca, Sr) AlSiN$_3$:Eu$^{2+}$ |
|  | Y$_3$Al$_5$O$_{12}$:Ce$^{3+}$ |
|  | (Sr, Ba, Ca, Mg) 2SiO$_4$:Eu$^{2+}$ |
|  | K$_2$SiF$_6$:Mn$^{4+}$ |

TABLE 1-continued

| Purpose | Fluorescent Substance |
| --- | --- |
|  | SrLiAl$_3$N$_4$:Eu |
|  | Ln$_{4-x}$ (Eu$_z$M$_{1-z}$) $_x$Si$_{12-y}$Al$_y$O$_{3+x+y}$N$_{18-x-y}$ |
|  | (0.5 ≤ x ≤ 3, 0 < z < 0.3, and 0 < y ≤ 4) |
|  | K$_2$TiF$_6$:Mn$^{4+}$ |
|  | NaYF$_4$:Mn$^{4+}$ |
|  | NaGdF$_4$:Mn$^{4+}$ |
| Electronics | Lu$_3$Al$_5$O$_{12}$:Ce$^{3+}$ |
| (Headlamps, | Ca-α-SiAlON:Eu$^{2+}$ |
| etc.) | La$_3$Si$_6$N$_{11}$:Ce$^{3+}$ |
|  | (Ca, Sr) AlSiN$_3$:Eu$^{2+}$ |
|  | Y$_3$Al$_5$O$_{12}$:Ce$^{3+}$ |
|  | K$_2$SiF$_6$:Mn$^{4+}$ |
|  | SrLiAl$_3$N$_4$:Eu |
|  | Ln$_{4-x}$ (Eu$_z$M$_{1-z}$) $_x$Si$_{12-y}$Al$_y$O$_{3+x+y}$N$_{18-x-y}$ |
|  | (0.5 ≤ x ≤ 3, 0 < z < 0.3, and 0 < y ≤ 4) |
|  | K$_2$TiF$_6$:Mn$^{4+}$ |
|  | NaYF$_4$:Mn$^{4+}$ |
|  | NaGdF$_4$:Mn$^{4+}$ |

The wavelength conversion material may include quantum dots (QDs), replacing the fluorescent substance or mixed with the fluorescent substance.

FIG. 16 is a view illustrating a cross-sectional view of a quantum dot. The quantum dot may have a core-shell structure formed of a II-VI group or III-V group compound semiconductor. For example, the quantum dot may include a core such as CdSe or InP, and a shell such as ZnS or ZnSe. In addition, the quantum dot may further include a ligand for stabilizing the core and the shell. For example, a diameter of the core may be in a range of 1 nm to 30 nm, and preferably 3 nm to 10 nm. A thickness of the shell may be in a range of 0.1 nm to 20 nm, and preferably 0.5 nm to 2 nm.

The quantum dot may implement a variety of colors according to a size thereof. In particular, when the quantum dot is used as a substitute material for the fluorescent substance, the quantum dot may be used as a red or green fluorescent substance. When the quantum dot is used, a narrow FWHM (e.g. about 35 nm) may be implemented.

The wavelength conversion material may be implemented in such a manner to be included in an encapsulant. Alternatively, the wavelength conversion material may be prepared as a film in advance to be attached to a surface of an LED chip or an optical structure such as a light guide plate. In this case, the wavelength conversion material may have a uniform thickness to be easily applied to a preferred area.

FIGS. 17, 18, 19, 20, 21, 22, 23, 24A, 24B, and 25 illustrate backlight units employing semiconductor light-emitting devices according to example embodiments of the inventive concepts.

Figure 17:
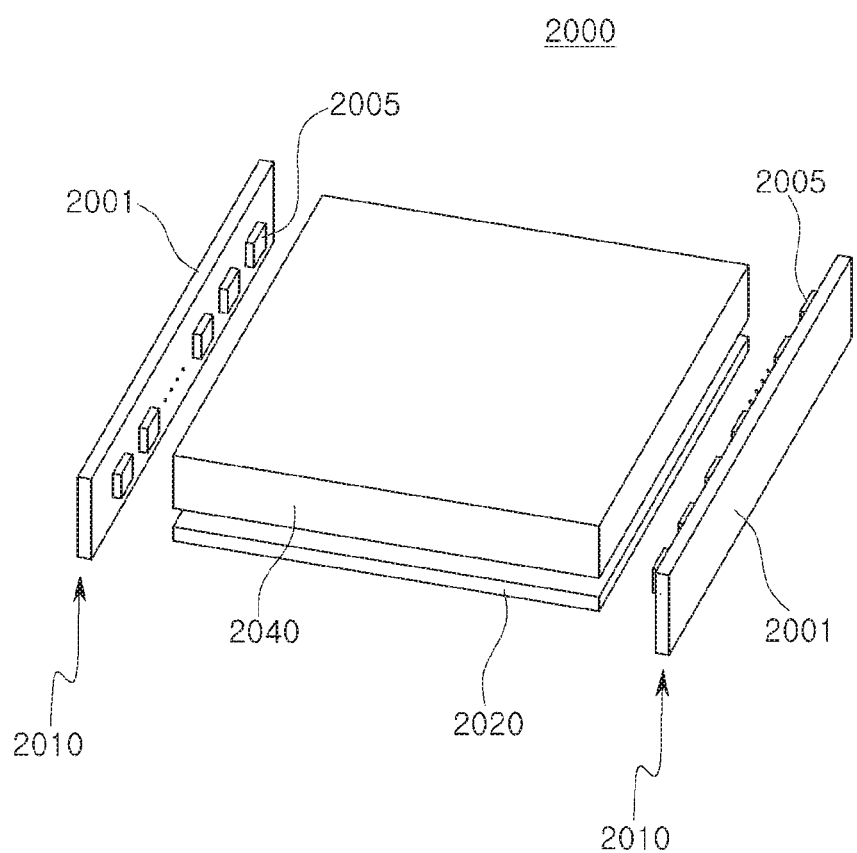
FIGS. 17, 18, 19, 20, 21, 22, 23, 24A, 24B, and 25 illustrate backlight units employing semiconductor light-emitting devices according to some example embodiments of the inventive concepts.

FIG. 17 is a perspective view schematically illustrating a backlight unit according to some example embodiments of the inventive concepts.

Referring to FIG. 17, a backlight unit 2000 may include a light guide plate 2040 and a light source module 2010 disposed at each side of the light guide plate 2040. In addition, the backlight unit 2000 may further include a reflector 2020 disposed below the light guide plate 2040. The backlight unit 2000 according to the example embodiment may be an edge-type backlight unit.

In some example embodiments, the light source module 2010 may be provided on only one side of the light guide plate 2040, or additionally provided to the other side of the light guide plate 2040. The light source module 2010 may include a PCB 2001 and a plurality of light sources 2005 mounted on the PCB 2001. Here, the plurality of light sources 2005 may include the semiconductor light-emitting devices 100 to 900 according to various example embodiments of the inventive concepts.

Figure 18:
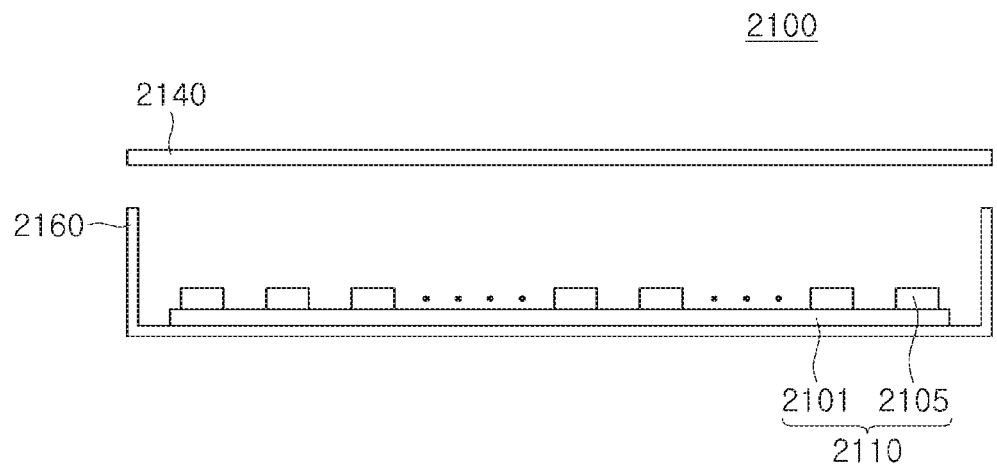

FIG. 18 illustrates a direct-type backlight unit according to some example embodiments of the inventive concepts.

Referring to FIG. 18, a backlight unit 2100 may include a light diffusion plate 2140 and a light source module 2110 disposed below the light diffusion plate 2140. In addition, the backlight unit 2100 may further include a bottom case 2160 disposed below the light diffusion plate 2140 and accommodating the light source module 2110. The backlight unit 2100 according to the example embodiment may be the direct-type backlight unit.

The light source module 2110 may include a PCB 2101 and a plurality of light sources 2105 mounted on the PCB 2101. Here, the plurality of light sources 2105 may include the semiconductor light-emitting devices 100 to 900 according to various example embodiments of the inventive concepts.

Figure 19:
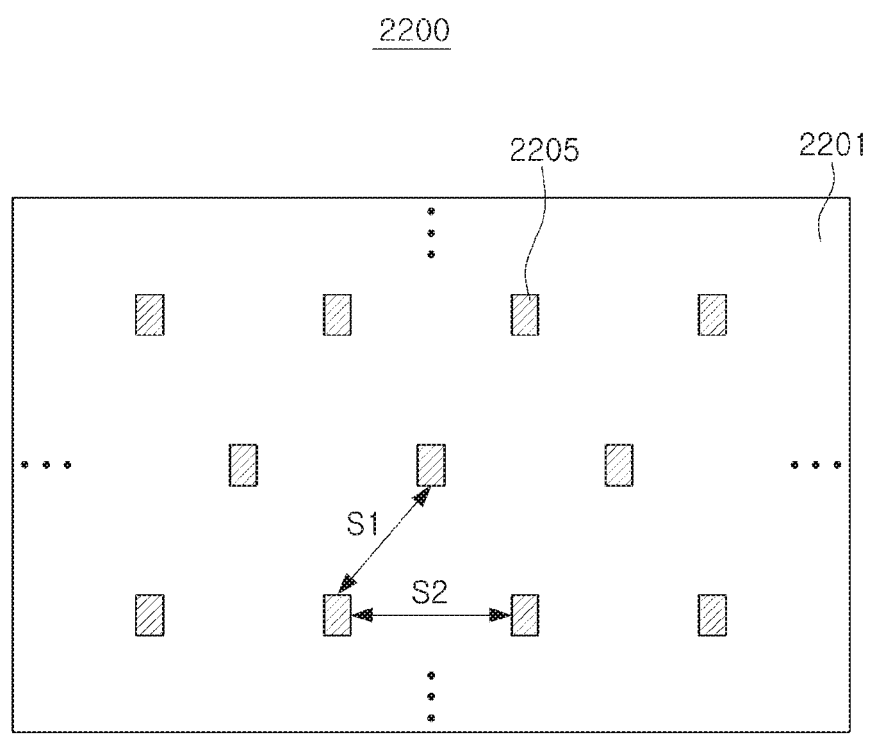

FIG. 19 illustrates an arrangement of light sources of a direct-type backlight unit to some example embodiments of the inventive concepts.

The direct-type backlight unit 2200 according to the example embodiment may include a plurality of light sources 2205 arranged on a substrate 2201. Here, the light sources 2205 may include the semiconductor light-emitting devices 100 to 900 according to various example embodiments of the inventive concepts.

The light sources 2205 may have a matrix structure arranged in rows and columns, wherein each of the rows and columns has a zigzag shape. That is, a second matrix having the same structure as a first matrix in which the plurality of light sources 2205 are aligned in rows and columns having a straight line shape may be disposed inside the first matrix. This may be understood that a light source 2205 belonging to the second matrix is disposed inside a square formed by four adjacent light sources 2205 belonging to the first matrix.

However, the first matrix and the second matrix may be arranged in different structures and at different intervals as needed in order to improve brightness uniformity and light efficiency in the direct-type backlight unit. Besides the arrangement structure of the plurality of light sources, distances S1 and S2 between adjacent light sources may be optimized to ensure brightness uniformity.

In this manner, the rows and columns consisting of the light sources 2205 may be arranged not in straight lines but in zigzags, and thus the number of light sources 2205 may be reduced by about 15% to 25% with respect to the same light-emitting area.

Figure 20:
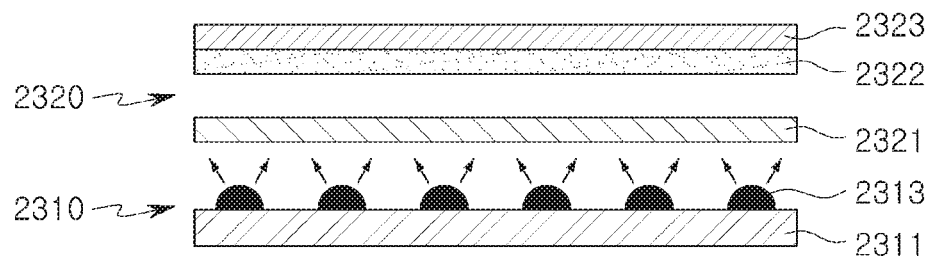

FIG. 20 illustrates a direct-type backlight unit according to another example embodiment of the inventive concepts.

Referring to FIG. 20, a backlight unit 2300 according to the example embodiment may include an optical sheet 2320 and a light source module 2310 disposed below the optical sheet 2320. The optical sheet 2320 may include a diffusion sheet 2321, a collecting sheet 2322, and a protection sheet 2323.

The light source module 2310 may include a circuit board 2311, a plurality of light sources 2312 (please refer to FIG. 21) mounted on the circuit board 2311, and a plurality of optical devices 2313 mounted on plurality of light sources 2312. The plurality of light sources 2312 may include the semiconductor light-emitting devices 100 to 900 according to various example embodiments of the inventive concepts.

The optical device 2313 may control an orientation angle of light through refraction of light. In particular, the optical device 2313 may have a wide orientation angle lens spreading light emitted from the light source 2312 in a wide area. Since the light source 2312 having the optical device 2313 attached thereon has wider light distribution, the number of light sources 2312 required for the same area may be reduced when the light source module is used in a backlight or a flat panel light.

Figure 21:
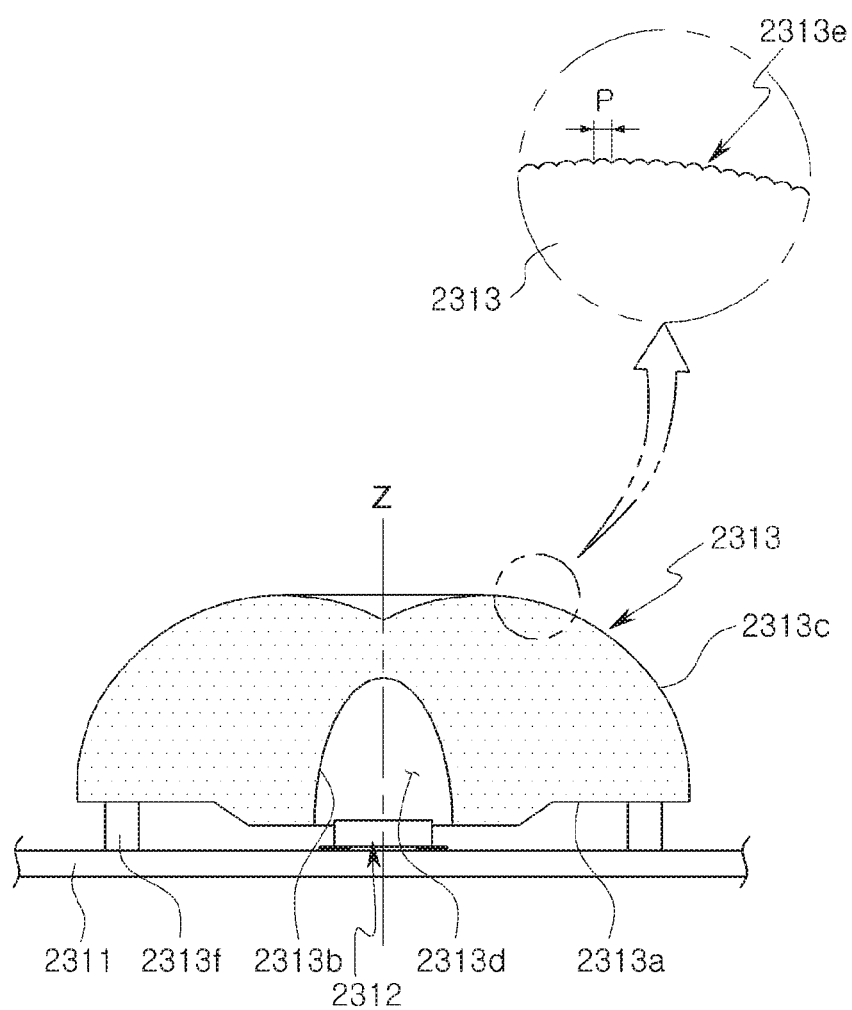

Referring to FIG. 21, the optical device 2313 may include a bottom surface 2313*a* disposed on the light source 2312, an incident surface 2313*b* on which light emitted from the light source 2312 is incident, and an emitting surface 2313*c* through which the light is emitted outwardly.

The bottom surface 2313*a* may include a groove 2313*d* recessed toward the emitting surface 2313*c* in a center through which an optical axis Z of the light source 2312 passes. A surface of the groove 2313*d* may be defined as the incident surface 2313*b* through which light generated in the light source 2312 is incident. That is, the incident surface 2313*b* may form the surface of the groove 2313*d*.

The bottom surface 2313*a* may have a non-planar structure as a whole, in which a center portion connected to the incident surface 2313*b* partially protrudes toward the light source 2312. That is, different from a normal structure in which the entire bottom surface 2313*a* is planar, the bottom surface 2313*a* of the example embodiment may partially protrude around the groove 2313*d*. A plurality of supports 2313*f* may be disposed on the bottom surface 2313*a*. When the optical device 2313 is mounted on the circuit board 2311, the plurality of supports 2313*f* may fixedly support the optical device 2313.

The emitting surface 2313*c* may upwardly (in a light-emitting direction) protrude from an edge connected to the bottom surface 2313*a* in a dome shape, and a center portion through which the optical axis Z passes may be concavely recessed toward the groove 2313*d* to have an inflection point. A plurality of embossings 2313*e* may be periodically arranged on the emitting surface 2313*c* from the optical axis Z toward the edge. The plurality of embossings 2313*e* may have a ring shape corresponding to a horizontal cross-section of the optical device 2313, and may form concentric circles with the optical axis Z as a center. In addition, the plurality of embossings 2313*e* may be arranged to radially spread along the emitting surface 2313*c* with the optical axis Z as a center to form a periodic pattern.

The plurality of embossings 2313*e* may be spaced apart in a regular pitch P to form a pattern. In this case, the pitch P of the embossings 2313*e* may be in the range of 0.01 mm to 0.04 mm. The plurality of embossings 2313*e* may compensate for differences in performance between the optical devices 2313 due to small processing errors occurring in a process of fabricating the optical devices 2313, thereby improving uniformity in optical distribution.

Figure 22:
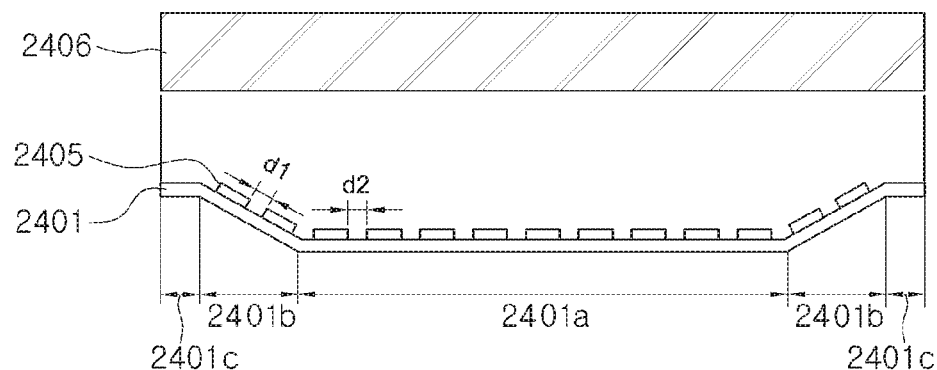

FIG. 22 illustrates a direct-type backlight unit according to another example embodiment of the inventive concepts.

Referring to FIG. 22, a backlight unit 2400 may include a circuit board 2401, light sources 2405 mounted on the circuit board 2401, and one or more optical sheets 2406 disposed above the light sources 2405. The light sources 2405 may be white light-emitting apparatuses, and may include the semiconductor light-emitting devices 100 to 900 according to various example embodiments of the inventive concepts.

The circuit board 2401 employed in the example embodiments illustrated in FIG. 22 may include a first planar portion 2401*a* corresponding to a main portion, an inclined portion 2401*b*, at least a part of which is angled, disposed around the first planar portion 2401*a*, and a second planar portion 2401*c* disposed in a corner of the circuit board 2401, that is, at an outside of the inclined portion 2401b. The light sources 2405 may be arranged at a first distance d1 on the inclined portion 2401b, and one or more light sources 2405 may also be arranged at a second distance d2 on the first planar portion 2401a. The first distance d1 may be the same as the second distance d2. A width of the inclined portion 2401b (or a length in a cross-sectional view) may be narrower than a width of the first planar portion 2401a, and wider than a width of the second planar portion 2401c. In addition, at least one light source 2405 may be arranged on the second planar portion 2401c, as necessary.

An inclination of the inclined portion 2401b with respect to the first planar portion 2401a may be greater than 0° and lower than 90°. By having such a structure, the circuit board 2401 may maintain uniform brightness even in the vicinity of an edge of the optical sheet 2406.

Figure 23:
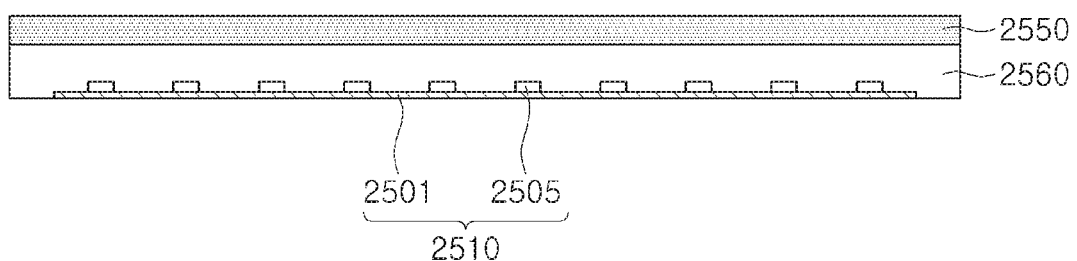
Figure 24A:
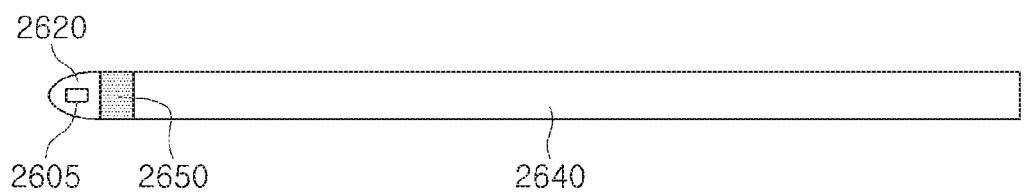
Figure 24B:
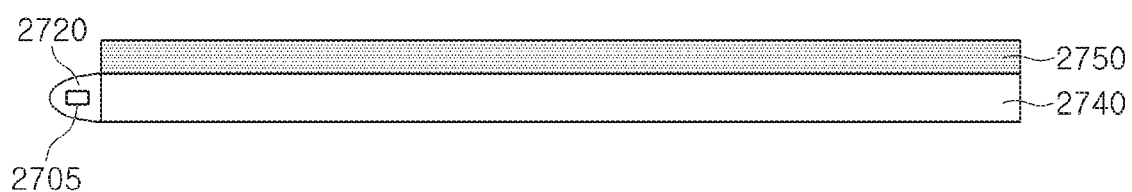

FIGS. 23, 24A, and 24B are cross-sectional views schematically illustrating backlight units according to various example embodiments of the inventive concepts.

As illustrated in FIGS. 23, 24A, and 24B, wavelength-converting parts 2550, 2650, and 2750 may be arranged not in light sources 2505, 2605, and 2705 in backlight units 2500, 2600, and 2700, but externally from the light sources 2505, 2605, and 2705 in the backlight units 2500, 2600, and 2700 to convert light.

First, referring to FIG. 23, the backlight unit 2500 may be a direct-type backlight unit, and may include the wavelength-converting part 2550, a light source module 2510 disposed below the wavelength-converting part 2550, and a bottom case 2560 accommodating the light source module 2510. In addition, the light source module 2510 may include a PCB 2501 and the plurality of light sources 2505 mounted on the PCB 2501. The light sources 2505 may include the semiconductor light-emitting devices 100 to 900 according to various example embodiments of the inventive concepts.

In the backlight unit 2500 according to some example embodiments, the wavelength-converting part 2550 may be disposed on the bottom case 2560. Accordingly, a wavelength of at least a portion of light emitted from the light source module 2510 may be converted by the wavelength-converting part 2550. The wavelength-converting part 2550 may be applied by being fabricated as a separate film, or may be provided in a form integrated with a light diffuser.

Referring to FIGS. 24A and 24B, the backlight units 2600 and 2700 may be edge-type backlight units, and may respectively include wavelength-converting parts 2650 and 2750, light guide plates 2640 and 2740, and reflectors 2620 and 2720 and light sources 2605 and 2705 disposed at one sides of the light guide plates 2640 and 2740.

Light emitted from the light sources 2605 and 2705 may be guided into the light guide plates 2640 and 2740 by the reflectors 2620 and 2720. In the backlight unit 2600 in FIG. 24A, the wavelength-converting part 2650 may be disposed between the light guide plate 2640 and the light source 2605. In the backlight unit 2700 of FIG. 24B, the wavelength-converting part 2750 may be disposed on a light-emitting surface of the light guide plate 2740.

The wavelength-converting parts 2550, 2650, and 2750 of FIGS. 23, 24A, and 24B may include normal fluorescent substances. In particular, when a QD fluorescent substance is used to compensate for the characteristics of QDs vulnerable to heat generated in the light sources or to moisture, the structures of the wavelength-converting parts 2550, 2650, and 2750 illustrated in FIGS. 23, 23A, and 24B may be utilized in the backlight units 2500, 2600, and 2700.

Figure 25:
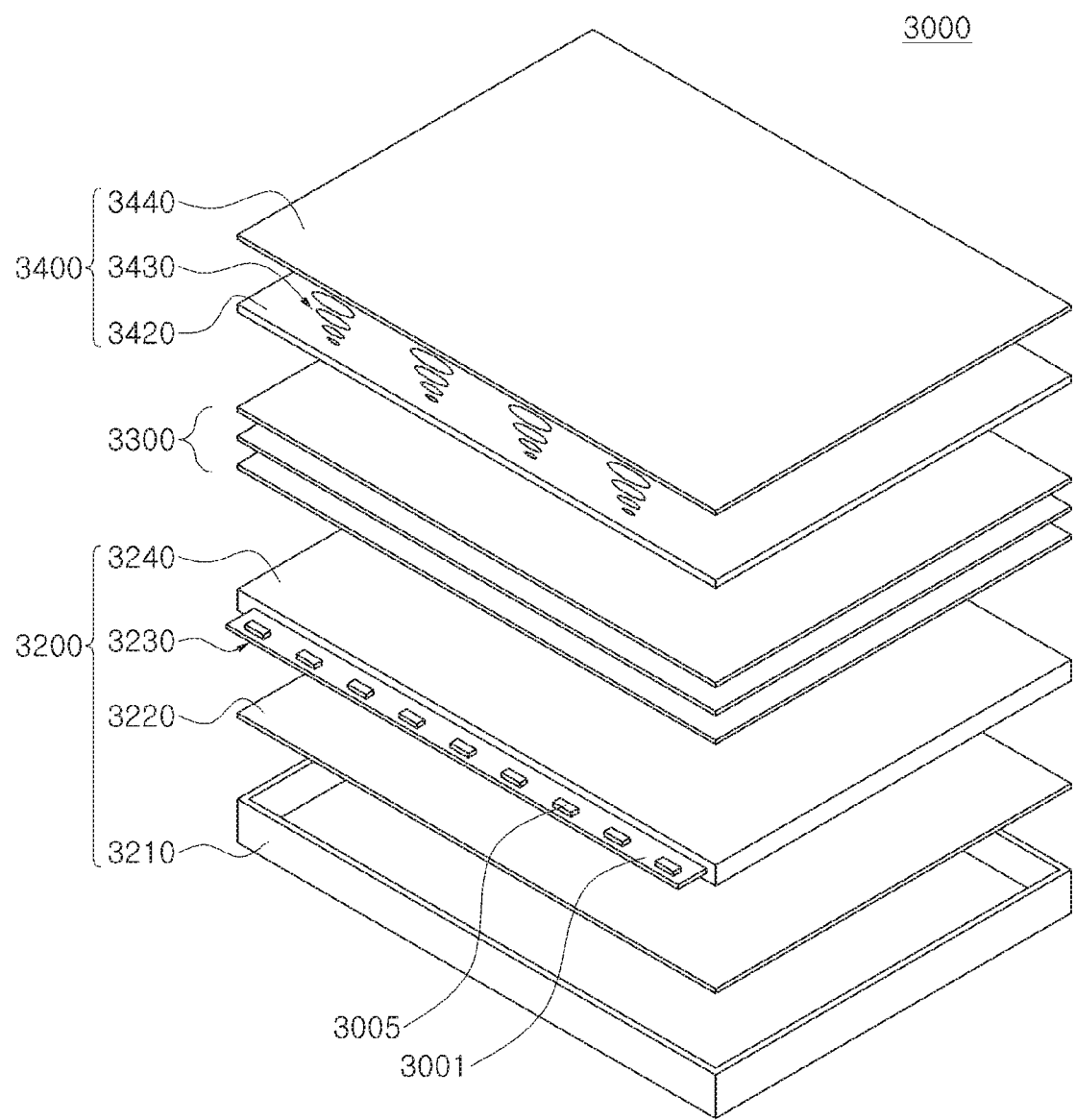

FIG. 25 is an exploded perspective view of a display apparatus employing a semiconductor light-emitting device package according to example embodiments of the inventive concepts.

Referring to FIG. 25, a display apparatus 3000 may include a backlight unit 3200, an optical sheet 3300, or an image display panel 3400 such as a liquid crystal panel.

The backlight unit 3200 may include a bottom case 3210, a reflector 3220, alight guide plate 3240, and alight source module 3230 disposed on at least one side of the light guide plate 3240. The light source module 3230 may include a PCB 3001 and light sources 3005. In particular, the light sources 3005 may be side-view type light-emitting devices mounted on a side adjacent to a light-emitting surface. The light sources 3005 may include the semiconductor light-emitting devices 100 to 900 according to various example embodiments of the inventive concepts.

The optical sheet 3300 may be disposed between the light guide plate 3240 and the image display panel 3400, and may include various types of a sheet, such as a diffusion sheet, a prism sheet, or a protection sheet.

The image display panel 3400 may display an image using light emitted from the optical sheet 3300. The image display panel 3400 may include an array substrate 3420, a liquid crystal film 3430, and a color filter substrate 3440. The array substrate 3420 may include pixel electrodes arranged in a matrix form, thin-film transistors to apply a driving voltage to the pixel electrodes, and signal lines for operating the thin-film transistors. The color filter substrate 3440 may include a transparent substrate, a color filter, and a common electrode. The color filter may include filters selectively transmitting light having specific wavelengths in white light emitted from the backlight unit 3200. The liquid crystal film 3430 may be rearranged by an electric field formed between the pixel electrodes and the common electrode to adjust light transmittance. The light having the adjusted light transmittance may pass through the color filter of the color filter substrate 3440 to display the image. The image display panel 3400 may further include a driving circuit unit processing an image signal.

In the display apparatus 3000 according to some example embodiments, since the light sources 3005 emitting blue light, green light, and red light which have relatively narrow FWHMs, a blue color, a green color, and a red color having a relatively high color purities may be implemented after the emitted light passes through the color filter substrate 3440.

Figure 26:
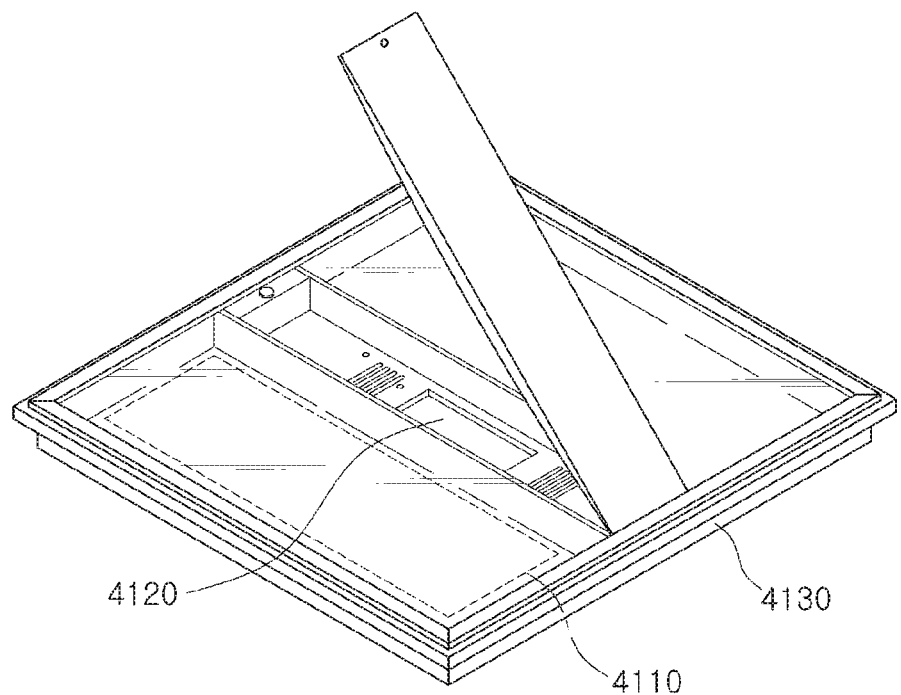
FIG. 26 is a perspective view schematically illustrating a flat panel lighting apparatus employing a semiconductor light-emitting device according to some example embodiments of the inventive concepts.

FIG. 26 is a perspective view schematically illustrating a flat panel lighting apparatus employing a semiconductor light-emitting device according to some example embodiments of the inventive concepts.

Referring to FIG. 26, a flat panel lighting apparatus 4100 may include a light source module 4110, a power supply 4120, and a housing 4130. According to some example embodiments, the light source module 4110 may include a light-emitting device array as a light source, and the power supply 4120 may include a light-emitting device driver. The light source module 4110 may include the semiconductor light-emitting devices 100 to 900 according to various example embodiments of the inventive concepts.

The light source module 4110 may include the light-emitting device array, and may have an overall planar shape. According to some example embodiments, the light-emitting device array may include a light-emitting device and a controller storing driving information of the light-emitting device.

The power supply 4120 may be configured to supply power to the light source module 4110. The housing 4130 may include an accommodating space to accommodate the light source module 4110 and the power supply 4120. In addition, the housing 4130 may be formed to have a hexahedral shape, one side of which being open, but is not limited thereto. The light source module 4110 may be disposed to emit light through the open side of the housing 4130.

Figure 27:
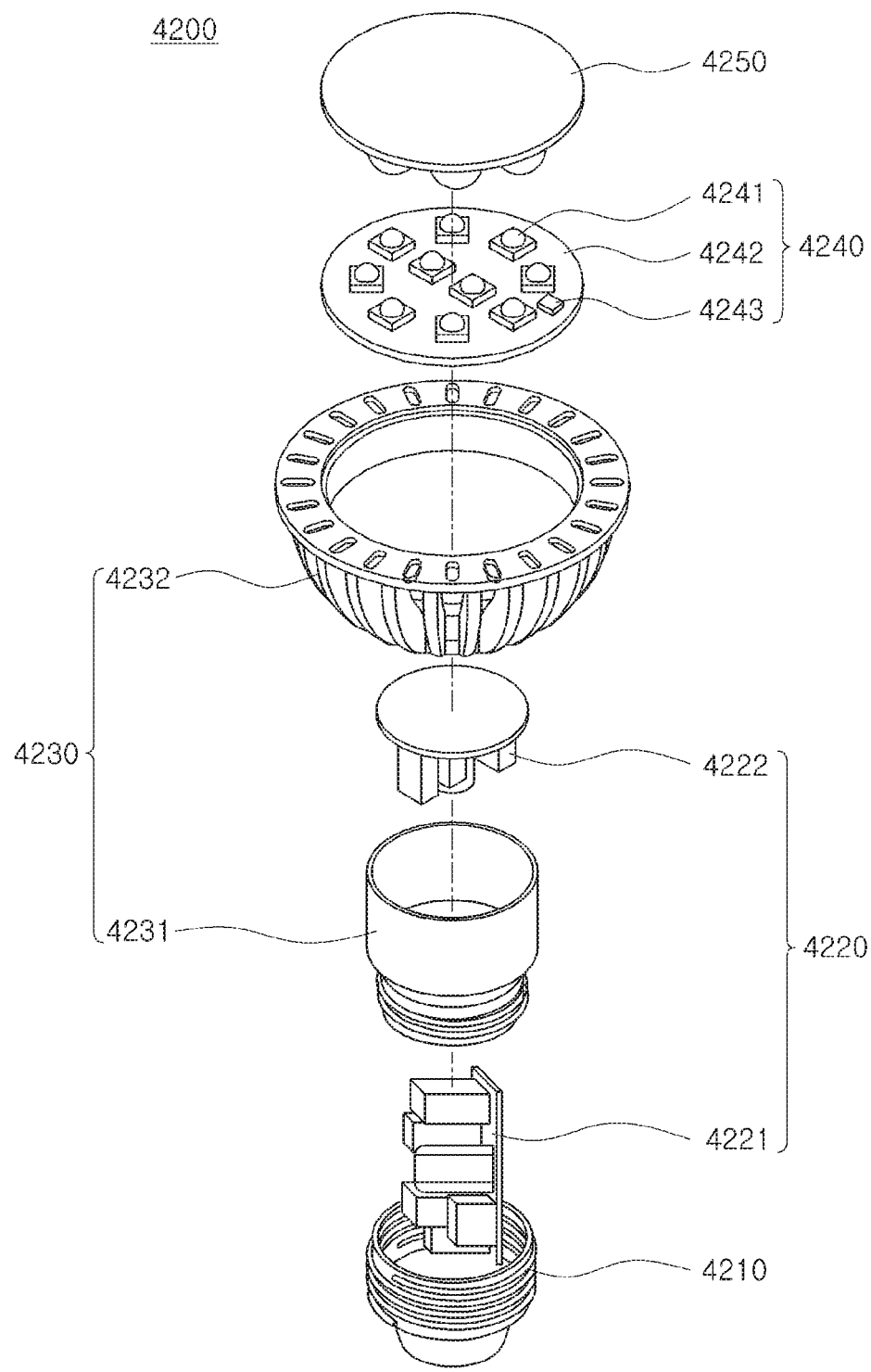
FIGS. 27 and 28 are exploded perspective views schematically illustrating bulb-type lamps as lighting apparatuses including some semiconductor light-emitting devices according to example embodiments of the inventive concepts.
Figure 28:
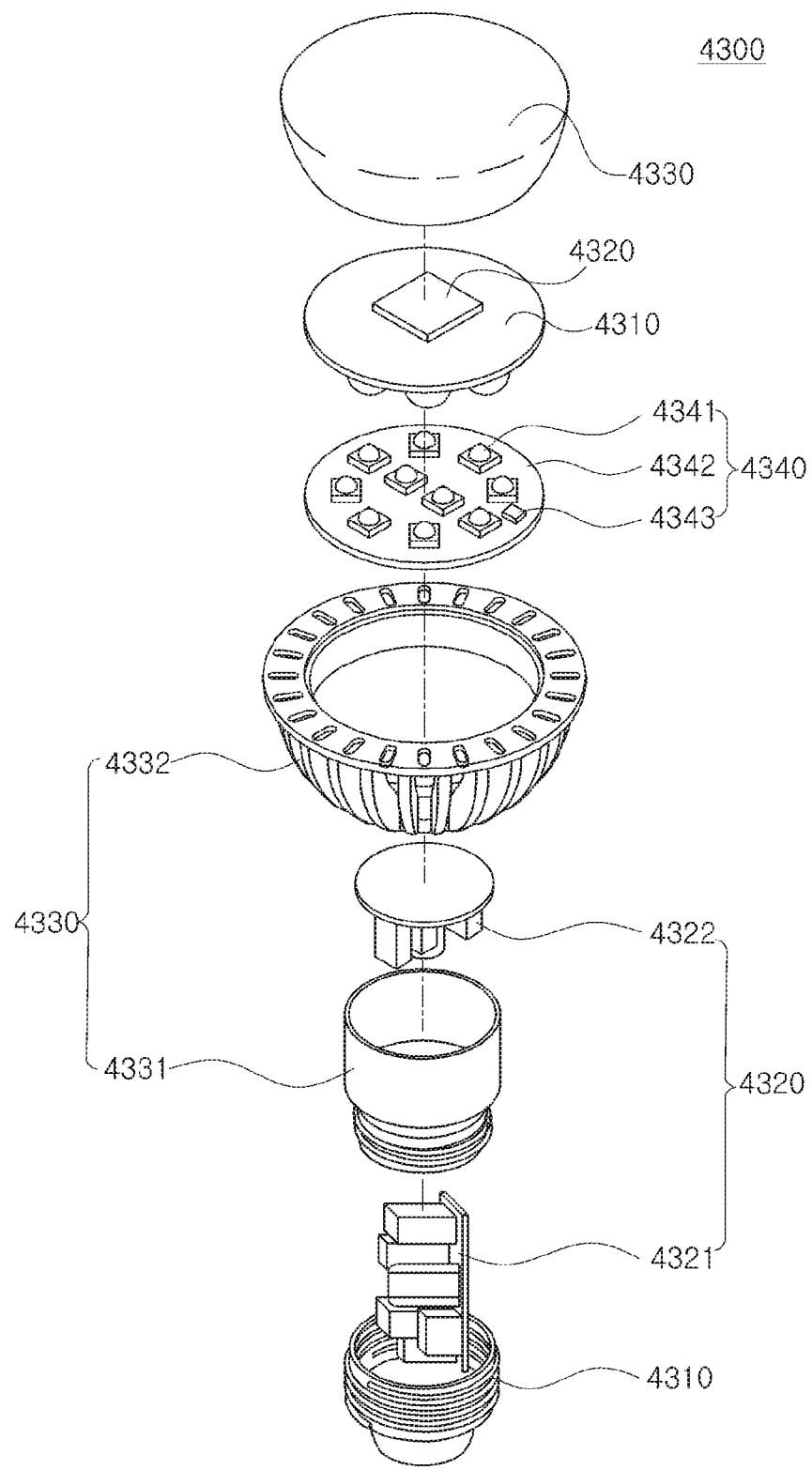

FIGS. 27 and 28 are exploded perspective views schematically illustrating bulb-type lamps as lighting apparatuses including semiconductor light-emitting devices according to example embodiments of the inventive concepts.

First, referring to FIG. 27, a lighting apparatus 4200 may include a socket 4210, a power supply 4220, a heat sink 4230, a light source module 4240, and an optical unit 4250. According to some example embodiments, the light source module 4240 may include a light-emitting device array, and the power supply 4220 may include a light-emitting device driver.

The socket 4210 may be compatible with a normal lighting apparatus. The power supplied to the lighting apparatus 4200 may be applied through the socket 4210. As illustrated in FIG. 27, the power supply 4220 may be separated into a first power supply 4221 and a second power supply 4222. The heat sink 4230 may include an internal heat sink 4231 and an external heat sink 4232. The internal heat sink 4231 may be directly connected to the light source module 4240 and/or the power supply 4220, and may thereby serve to transmit heat to the external heat sink 4232. The optical unit 4250 may include an internal optical unit (not shown) and an external optical unit (not shown), and may be configured to uniformly spread light emitted from the light source module 4240.

The light source module 4240 may receive power from the power supply 4220 to emit light to the optical unit 4250. The light source module 4240 may include one or more light-emitting devices 4241, a circuit board 4242, and a controller 4243. The controller 4243 may store driving information of the light-emitting devices 4241. The light-emitting devices 4241 may include the semiconductor light-emitting devices 100 to 900 according to various example embodiments of the inventive concepts.

Referring to FIG. 28, unlike the lighting apparatus 4200 illustrated in FIG. 27, a lighting apparatus 4300 according to the example embodiment may include a reflector 4310 on the light source module 4340. The reflector 4310 may function to uniformly spread light from light sources in lateral and rearward directions to reduce glare.

A communications module 4320 may be mounted on the reflector 4310, and home-network communications may be implemented through the communications module 4320. For example, the communications module 4320 may be a wireless communications module using Zigbee®, Wi-Fi, or visible light wireless fidelity (Li-Fi) technology. The communications module 4320 may control functions such as on/off or brightness adjustment of an interior or exterior lighting apparatus by using a smartphone or a wireless controller. In addition, the communications module 4320 may control electronics and automobile systems in and around the home, such as a TV, a refrigerator, an air conditioner, a door lock, or an automobile, by a Li-Fi communications module using a visible light wavelength of the lighting apparatus installed in and around the home.

The reflector 4310 and the communications module 4320 may be covered by a cover 4330.

Figure 29:
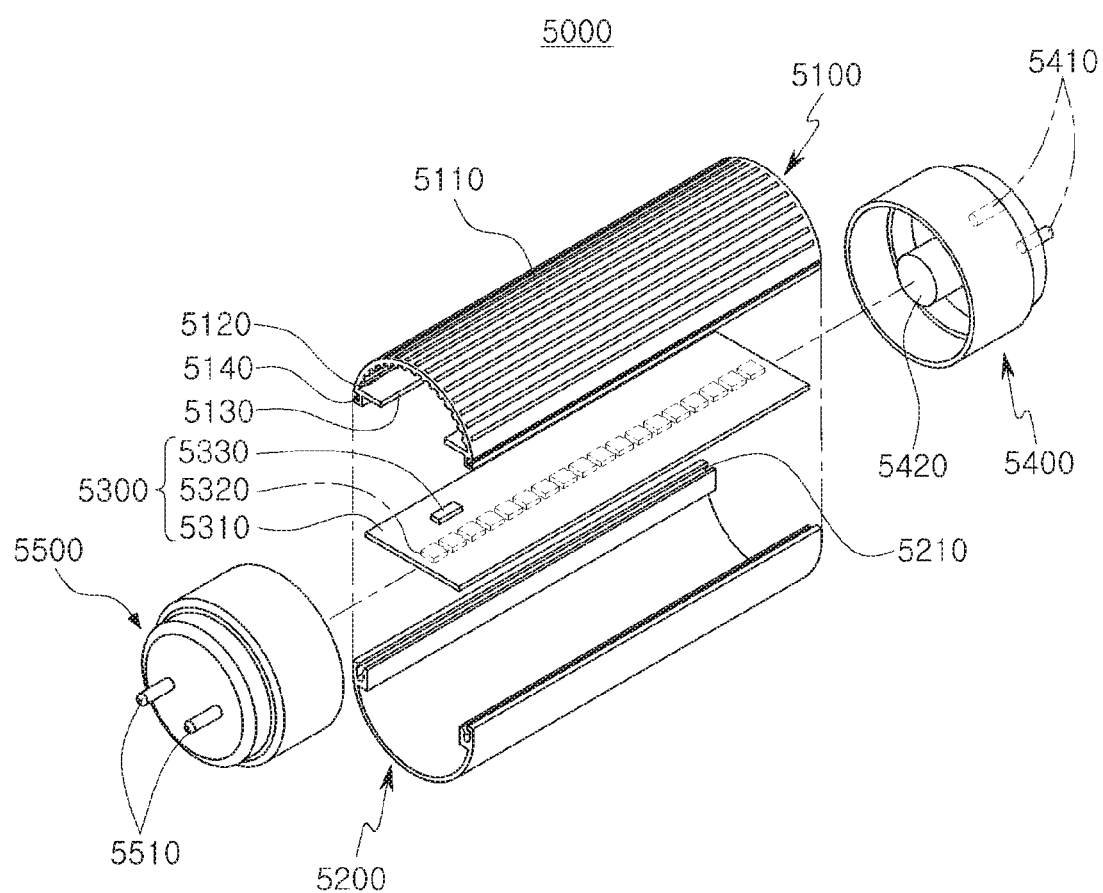
FIG. 29 is an exploded perspective view schematically illustrating a bar-type lamp employing a semiconductor light-emitting device according to some example embodiments of the inventive concepts.

FIG. 29 is an exploded perspective view schematically illustrating a bar-type lamp employing a semiconductor light-emitting device according to some example embodiments of the inventive concepts.

More specifically, a lighting apparatus 5000 may include a heat sink unit 5100, a cover 5200, a light source module 5300, a first socket 5400, and a second socket 5500. A plurality of heat sink fins 5110 and 5120 may be disposed on an inner surface and/or an outer surface of the heat sink unit 5100 in the form of ridges, and the heat sink fins 5110 and 5120 may be designed to have a variety of shapes and distances therebetween. An overhang-type support 5130 may be formed at an inner side of the heat sink unit 5100. The light source module 5300 may be fastened on the support 5130. A fastening protrusion 5140 may be formed at each end portion of the heat sink unit 5100.

A fastening groove 5210 may be formed in the cover 5200, and the fastening protrusion 5140 of the heat sink unit 5100 may be combined with the fastening groove 5210 in a hook-coupling structure. Positions of the fastening groove 5210 and the fastening protrusion 5140 may be exchanged.

The light source module 5300 may include a light-emitting device array. The light source module 5300 may include a PCB 5310, a light source 5320, and a controller 5330. As described above, the controller 5330 may store driving information of the light source 5320. Circuit interconnections for operating the light source 5320 may be formed on the PCB 5310. In addition, the PCB 5310 may further include other components for operating the light source 5320. The light source 5320 may include at least one of the semiconductor light-emitting devices 100 to 900 according to various example embodiments of the inventive concepts.

The first and second sockets 5400 and 5500 may be a pair of sockets, and may have a structure combined with both end portions of a cylindrical cover unit formed of the heat sink unit 5100 and the cover 5200. For example, the first socket 5400 may include an electrode terminal 5410 and a power device 5420, and the second socket 5500 may include a dummy terminal 5510. In addition, an optical sensor and/or a communications module may be embedded in one of the first socket 5400 and the second socket 5500. For example, the optical sensor and/or the communications module may be embedded in the second socket 5500 including the dummy terminal 5510. As another example, the optical sensor and/or the communications module may be embedded in the first socket 5400 including the electrode terminal 5410.

Figure 30:
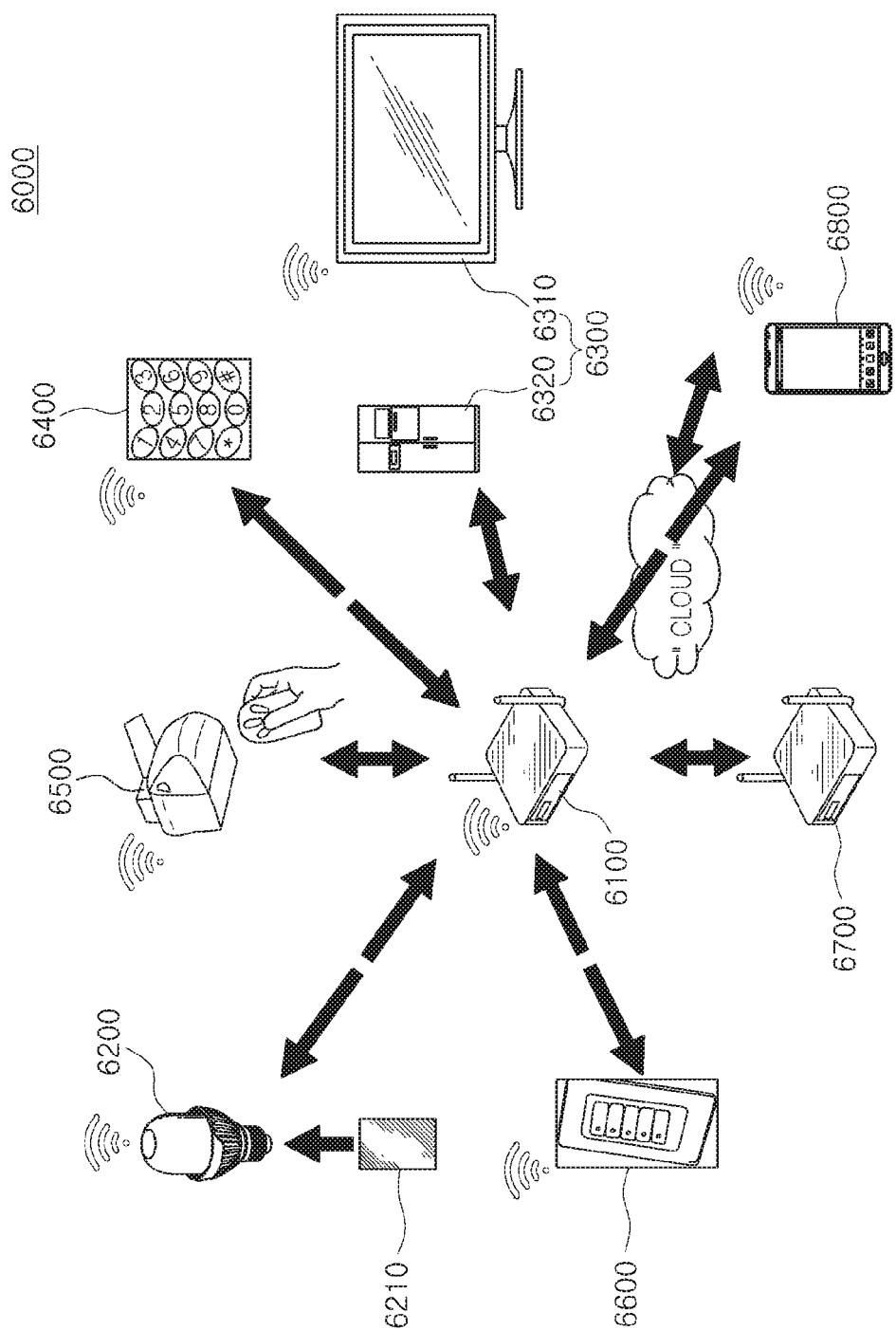
FIGS. 30, 31, and 32 are schematic diagrams illustrating lighting control network systems to which semiconductor light-emitting devices according to some example embodiments of the present inventive concepts.
Figure 31:
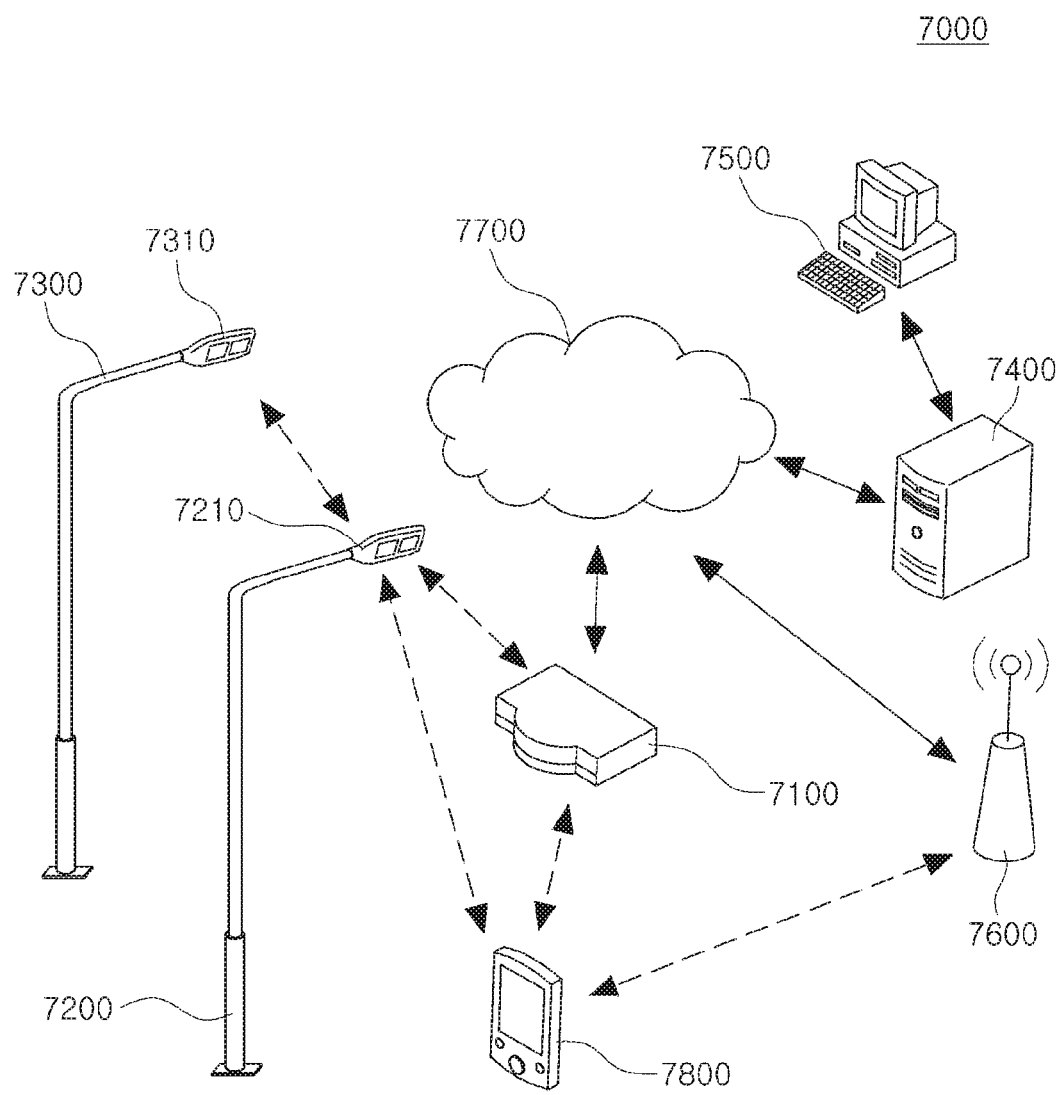
Figure 32:
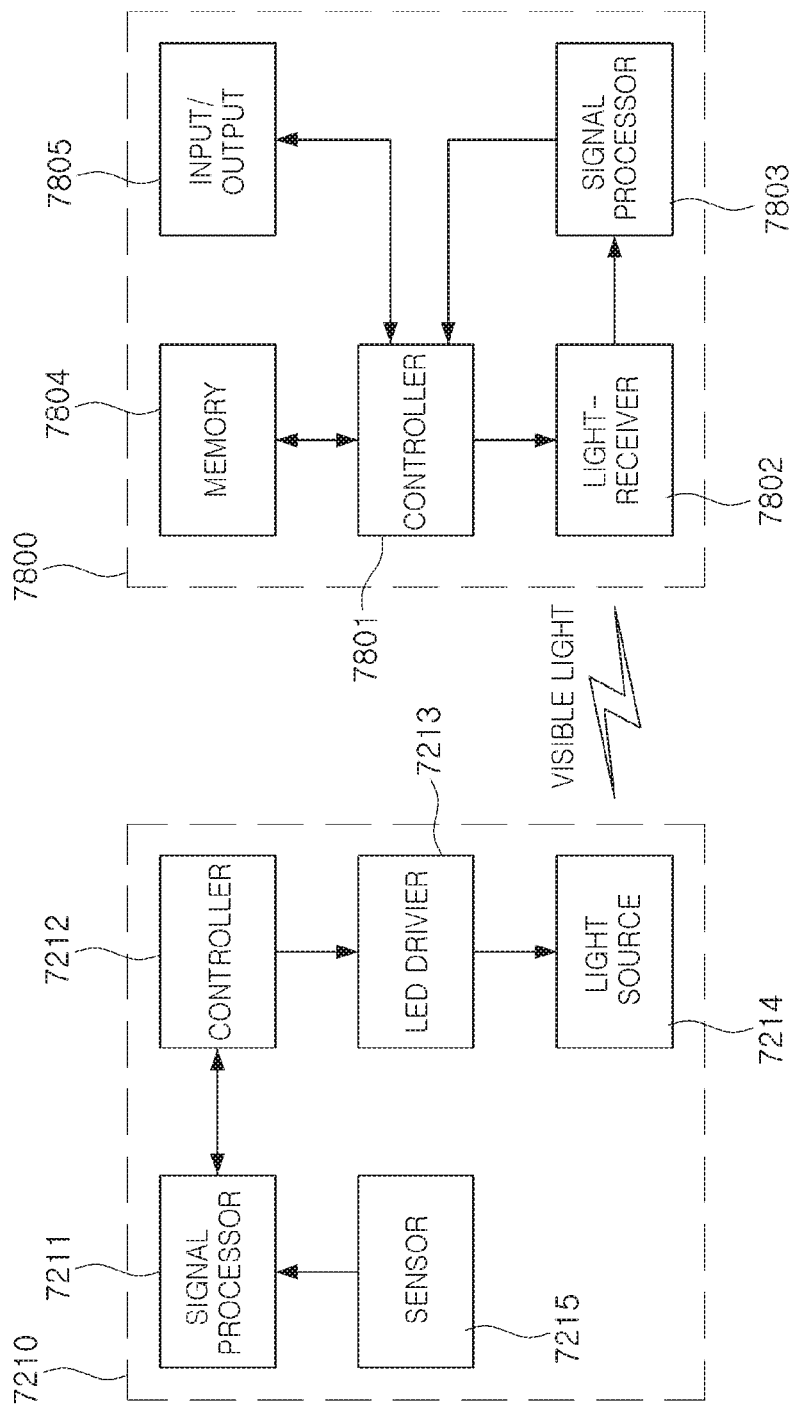

FIGS. 30, 31, and 32 are schematic diagrams illustrating lighting control network systems to which semiconductor light-emitting devices according to example embodiments are included.

First, FIG. 30 is a schematic diagram illustrating an indoor lighting control network system. A network system 6000 according to the example embodiment may be a complex smart light-network system in which lighting technology using a light-emitting device such as an LED is combined with Internet of Things (IoT) technology, wireless communications technology, or the like. The network system 6000 may be implemented using a variety of lighting apparatuses and wired/wireless communications apparatuses. The network system 6000 may be implemented by a sensor, a controller, a communications device, software for network control and maintenance, or the like.

The network system 6000 may be utilized in an open area, such as a park or a street, as well as in a closed space defined within a building, such as a home or an office. The network system 6000 may be implemented based on an IoT environment so as to collect/process a variety of information and provide the information to a user. Here, an LED lamp 6200 included in the network system 6000 may function to not only control the illumination of itself by receiving information about a surrounding environment from a gateway 6100, but also check and control operations of other apparatuses 6300 to 6800 belonging to the IoT environment based on, for example, a visible light communications function of the LED lamp 6200.

Referring to FIG. 30, the network system 6000 may include the gateway 6100 processing data transmitted and received according to different communication protocols, the LED lamp 6200 connected to the gateway 6100 to enable communication and including a light-emitting device, and the plurality of apparatuses 6300 to 6800 connected to the gateway 6100 to enable communication according to a variety of wireless communications systems. In order to implement the network system 6000 based on the IoT environment, the LED lamp 6200 and each of the apparatuses 6300 to 6800 may include at least one communications module. In some example embodiments, the LED lamp 6200 may be connected to the gateway 6100 by a wireless communication protocol, such as Wi-Fi, Zigbee®, or Li-Fi, to enable communications. In this regard, the LED lamp 6200 may include at least one lamp communications module 6210.

As described above, the network system 6000 may be utilized in an open area, such as a park or a street, as well as in a closed space defined within a building, such as a home or an office. When the network system 6000 is utilized at a home, the plurality of apparatuses 6300 to 6800 belonging to the network system 6000 and connected to the gateway 6100 to enable communications, based on the IoT technology, may include a household appliance 6300, a digital door lock 6400, a garage door lock 6500, a wall-mounted lighting switch 6600, a router 6700 for wireless network relay 6700, or a mobile apparatus 6800, such as a smartphone, a tablet, or a laptop computer.

In the network system 6000, the LED lamp 6200 may check an operating state of the variety of apparatuses 6300 to 6800 by using a wireless communications network (e.g. Wi-Fi, Zigbee®, or Li-Fi), or may automatically control the intensity of the LED lamp 6200 according to surrounding environment/conditions. In addition, the LED lamp 6200 may control the apparatuses 6300 to 6800 belonging to the network system 6000 by using LiFi communications using visible light emitted from the LED lamp 6200.

First, the LED lamp 6200 may automatically control the intensity thereof on the basis of information regarding the surrounding environment transferred from the gateway 6100 through the lamp communications module 7210 or collected from the sensor installed in the LED lamp 6200. For example, the intensity of the LED lamp 6200 may be automatically controlled according to the type of a program being broadcast on a television 6310 or a brightness of a screen. For this, the LED lamp 6200 may receive operating information of the television 6310 from the lamp communications module 7210 connected to the gateway 6100. The lamp communications module 7210 may be integrated and modularized with the sensor and/or controller included in the LED lamp 6200.

For example, when a program being broadcast on the television 6310 is a drama, a color temperature of the LED lamp 6200 may be lowered to 12,000 K or less (e.g. 5,000 K) according to a preset value, and color tones of the LED lamp 6200 may be adjusted to produce a cozy atmosphere. On the contrary, when the program is a comedy, the network system 6000 may be configured to increase the color temperature of the LED lamp 6200 to 5,000 K or more according to a preset value and adjust the LED lamp 6200 to emit blue-based white light.

In addition, when a period of time has elapsed after the digital door lock 6400 is locked in the absence of a person at home, all of the turned-on LED lamps 6200 may be turned off to reduce and/or prevent power wastage. In addition, when the digital door lock 6400 is locked in the absence of a person at home after a security mode is set through the mobile apparatus 6800, the LED lamp 6200 may be maintained in a turned-on state.

The operation of the LED lamp 6200 may be controlled according to the surrounding environment collected through various sensors connected to the network system 6000. For example, when the network system 6000 is implemented in a building, a light, a location sensor, and a communications module may be combined in the building, the light may be turned on or turned off by collecting information about locations of people in the building, or the collected information may be provided in real time to enable facility management or efficient use of idle spaces. Normally, lighting apparatuses such as the LED lamp 6200 may be placed in every space at each floor in a building, a variety of information may be collected through the sensor provided integrally with the LED lamp 6200, and the collected information may be utilized in the facility management or the use of idle spaces.

The LED lamp 6200 may be combined with an image sensor, a storage apparatus, the lamp communications module 7210, or the like to be utilized as an apparatus to maintain building security or detect an emergency and respond thereto. For example, when a smoke or temperature sensor is attached to the LED lamp 6200, an outbreak of fire may be quickly detected to reduce (and/or minimize) damages. Further, the brightness of the lightings may be controlled in consideration of external weather or sunlight to save energy and provide a comfortable lighting environment.

As described above, the network system 6000 may be utilized in an open area, such as a park or a street, as well as in a closed space defined within a building, such as a home or an office. When the network system 6000 is utilized at an open area with no physical limitations, it is relatively difficult to implement the network system 6000 due to distance limitations of wireless communications, and communications interference caused by various obstacles. By installing a sensor, a communications module, and the like in each lighting device and using the lighting device as an information-collecting tool and a communications-relaying tool, the network system 6000 may be more efficiently implemented in such an open environment. This will hereinafter be described with reference to FIG. 31.

FIG. 31 illustrates a network system 7000 applied to an open area according to some example embodiments of the inventive concepts. Referring to FIG. 31, the network system 7000 according to the example embodiment may include a communications connection apparatus 7100, a plurality of lighting apparatuses 7200 and 7300 installed at desired (and/or alternatively predetermined) distances to communicate with the communications connection apparatus 7100, a server 7400, a computer 7500 for managing the server 7400, a communications base station 7600, a communications network 7700 connecting the above-described communicable apparatuses, and a mobile apparatus 7800.

The plurality of lighting apparatuses 7200 and 7300 installed in an outside open space, such as a street or a park, may include smart engines 7210 and 7310, respectively.

Each of the smart engines 7210 and 7310 may include a sensor for collecting environmental information and s communications module, in addition to a light-emitting device emitting light and a driver driving the light-emitting device. The smart engines 7210 and 7310 may communicate with other nearby apparatuses according to a communications protocol, such as Wi-Fi, Zigbee®, Li-Fi, using the communications module.

For example, one smart engine 7210 may be connected to the other smart engine 7310 to enable communication. Here, for mutual communication between the smart engines 7210 and 7310, Wi-Fi extension technology (Wi-Fi Mesh) may be applied. At least one smart engine 7210 may be connected to the communications connection apparatus 7100 connected to the communications network 7700. In order to increase efficiency, the plurality of smart engines 7210 and 7310 may be combined in one group and connected to one communications connection apparatus 7100.

The communications connection apparatus 7100 may be an access point (AP) enabling wired/wireless communication, and may mediate communication between the communications network 7700 and another apparatus. The communications connection apparatus 7100 may be connected to the communications network 7700 by at least one of wired and wireless manners. For example, the communications connection apparatus 7100 may be mechanically accommodated inside one of the lighting apparatuses 7200 and 7300.

The communications connection apparatus 7100 may be connected to the mobile apparatus 7800 through a communication protocol such as Wi-Fi. A user of the mobile apparatus 7800 may receive the environmental information collected by the plurality of smart engines 7210 and 7310 using the communications connection apparatus 7100 connected to the smart engine 7210 of the lighting apparatus 7200. The environmental information may include nearby traffic information, weather information, or the like. The mobile apparatus 7800 may be connected to the communications network 7700 via the communications base station 7600, using a wireless cellular communications system such as 3G or 4G.

The server 7400 connected to the communications network 7700 may receive information collected by the smart engines 7210 and 7310 respectively installed in the lighting apparatuses 7200 and 7300, and may simultaneously monitor an operating state of each of the lighting apparatuses 7200 and 7300. In order to manage each of lighting apparatuses 7200 and 7300 based on the result of monitoring of the operating state of each of the lighting apparatuses 7200 and 7300, the server 7400 may be connected to the computer 7500 providing a management system. The computer 7500 may execute software monitoring and managing of the operating state of each lighting apparatuses 7200 and 7300, and in particular, each of the smart engines 7210 and 7310.

In order to transmit the information collected by the smart engines 7210 and 7310 to the mobile apparatus 7800 of the user, various communication methods may be applied. Referring to FIG. 31, by the communications connection apparatus 7100 connected to the smart engines 7210 and 7310, the information collected by the smart engines 7210 and 7310 may be transmitted to the mobile apparatus 7800, or the smart engines 7210 and 7310 and the mobile apparatus 7800 may be connected to directly communicate with each other. The smart engines 7210 and 7310 and the mobile apparatus 7800 may directly communicate with each other by Li-Fi communications. This will hereinafter be described with reference to FIG. 32.

FIG. 32 is a block diagram illustrating communications between the smart engine 7210 of the lighting apparatus 7200 and the mobile apparatus 7800 by visible light wireless communications. Referring to FIG. 32, the smart engine 7210 may include a signal processor 7211, a controller 7212, an LED driver 7213, a light source 7214, and a sensor 7215. The mobile apparatus 7800 connected to the smart engine 7210 by the visible light wireless communications may include a controller 7801, a light-receiver 7802, a signal processor 7803, a memory 7804, and an input/output 7805.

The visible light wireless communications (Li-Fi) technology may be a wireless communications technology in which information is wirelessly transferred using light of a visible wavelength band that can be recognized by the human eye. Such visible light wireless communications technology may be different from an existing wired optical communications technology and infrared wireless communications technology because it uses light of a visible light wavelength band, that is, a specific visible light frequency emitted by the above-described light-emitting device package, and may be different from the wired optical communications technology because it is operated in a wireless communication environment. In addition, the visible light wireless communications technology may be convenient since it is freely available without restrictions or authorization in terms of frequency use, unlike RF wireless communications, has excellent physical security, and has a distinction in that a user can see communications links. Most of all, the visible light wireless communications technology is characterized as fusion technology through which an original purpose as a light source and a communication function are simultaneously achieved.

Referring to FIG. 32, the signal processor 7211 of the smart engine 7210 may process data to be transmitted/received using the visible light wireless communications technology. In some example embodiments, the signal processor 7211 may process information collected by the sensor 7215 into data to be transmitted to the controller 7212. The controller 7212 may control operations of the signal processor 7211 and the LED driver 7213, and in particular, operations of the LED driver 7213 based on the data transmitted by the signal processor 7211. The LED driver 7213 may serve the light source 7214 to emit light according to a control signal transmitted by the controller 7212, and may transmit data to the mobile apparatus 7800.

The mobile apparatus 7800 may include a controller 7801, a memory 7804 to store data, an input/output 7805 including a display, a touchscreen, an audio output, a signal processor 7803, and a light-receiver 7802 to recognize visible light having data. The light-receiver 7802 may detect visible light and convert it into an electric signal, and the signal processor 7803 may decode data included in the electric signal converted by the light-receiver 7802. The controller 7801 may store the data decoded by the signal processor 7803 in the memory 7804, or may output the data through the input/output 7805 so that a user can recognize the data.

As set forth above, according to the example embodiments, a magnetic layer applying a magnetic field so that electrons and holes can remain for relatively long time in an active layer of a semiconductor light-emitting device may be provided. A portion of the magnetic layer may have a plurality of structures having repeating patterns. The magnetic layer and may be formed adjacent to each of first and second conductivity-type semiconductor layers of a light-emitting structure or on a reflective metal layer disposed in a trench of the light-emitting structure.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor light-emitting device, comprising:
   a light-emitting structure, the light-emitting structure including a plurality of layers, the plurality of layers including
      a first conductivity-type semiconductor layer,
      an active layer, and
      a second conductivity-type semiconductor layer;
   a first contact electrode coupled to the first conductivity-type semiconductor layer;
   a second contact electrode coupled to the second conductivity-type semiconductor layer; and
   an insulating layer on the light-emitting structure, the insulating layer including a magnetic layer, the magnetic layer including,
   a first magnetic layer on the first conductivity-type semiconductor layer, and
   a second magnetic layer on the second conductivity-type semiconductor layer, the first magnetic layer insulated from the second magnetic layer by at least a portion of the insulating layer,
   wherein the second magnetic layer includes a plurality of structures, the plurality of structures at least partially defining a pattern, the plurality of structures include at least one structure and at least one remaining structure, the at least one structure has a first magnetization direction, the at least one remaining structure has a second magnetization direction, and the first and second magnetization directions are different magnetization directions, both the first and second magnetization directions substantially parallel to an upper surface of the active layer.

2. The semiconductor light-emitting device of claim 1, wherein
   the second magnetic layer is on the second contact electrode.

3. The semiconductor light-emitting device of claim 1, wherein
   the semiconductor light-emitting device further includes first and second pad electrodes coupled to the first and second contact electrodes, respectively, each of the first and second pad electrodes including coplanar upper surfaces;
   the first magnetic layer is on the first contact electrode and is between the first contact electrode and the first pad electrode.

4. The semiconductor light-emitting device of claim 1, wherein the first magnetic layer is on the first conductivity-type semiconductor layer and adjacent to a side surface of the first contact electrode.

5. The semiconductor light-emitting device of claim 1, wherein
   the semiconductor light-emitting device further includes first and second pad electrodes coupled to the first and second contact electrodes, respectively, each of the first and second pad electrodes including coplanar upper surfaces;
   the first pad electrode is coupled to the first contact electrode through at least a separate portion of the insulating layer; and
   the second pad electrode is coupled to the second contact electrode through at least a further separate portion of the insulating layer.

6. The semiconductor light-emitting device of claim 1, wherein,
   the semiconductor light-emitting device further includes first and second pad electrodes coupled to the first and second contact electrodes, respectively, each of the first and second pad electrodes including coplanar upper surfaces;
   at least a portion of the magnetic layer is between the second pad electrode and the second contact electrode.

7. A semiconductor light-emitting device, comprising:
   a light-emitting structure including a plurality of layers, at least a portion of the light-emitting structure defining a trench, the plurality of layers including
      a first conductivity-type semiconductor layer,
      an active layer, and
      a second conductivity-type semiconductor layer;
   a reflective metal layer on the portion of the light-emitting structure defining the trench;
   first and second contact electrodes coupled to separate, respective ones of the first conductivity-type semiconductor layer and the second conductivity-type semiconductor layer; and
   a magnetic layer, the magnetic layer including a first magnetic layer on the reflective metal layer and a second magnetic layer on at least one of the first and second contact electrodes,
   wherein the second magnetic layer includes a plurality of structures, the plurality of structures at least partially defining a pattern, the plurality of structures include at least one structure and at least one remaining structure, the at least one structure has a first magnetization direction, the at least one remaining structure has a second magnetization direction, and the first and second magnetization directions are different magnetization directions, both the first and second magnetization directions substantially parallel to an upper surface of the active layer.

8. The semiconductor light-emitting device of claim 7, wherein
   the first magnetic layer and the light-emitting structure are spaced apart according to a first distance;
   the second magnetic layer and the light-emitting structure are spaced apart according to a second distance; and
   the first distance is smaller than the second distance.

9. The semiconductor light-emitting device of claim 7, wherein
   the first magnetic layer and the first conductivity-type semiconductor layer are spaced apart according to a first distance;
   the second magnetic layer and the second conductivity-type semiconductor layer are spaced apart according to a second distance; and
   the first distance is smaller than the second distance.

10. The semiconductor light-emitting device of claim 7, wherein
   the first contact electrode has a first thickness;
   the second contact electrode has a second thickness; and
   the first thickness is smaller than the second thickness.

11. A semiconductor light-emitting device, comprising:
a light-emitting structure including an active layer, the light-emitting structure configured to induce a current in a first direction through the active layer, the first direction being substantially perpendicular to an upper surface of the active layer; and
a magnetic layer on the light-emitting structure, the magnetic layer including first and second magnetic layers on separate, first and second conductivity-type semiconductor layers of the light-emitting structure. respectively, the first magnetic layer insulated from the second magnetic layer by at least a portion of an insulating layer,
wherein the first and second magnetic layers are each configured to generate a magnetic field having a magnetic field direction at the active layer, the magnetic field direction at the active layer being substantially parallel to the upper surface of the active layer,
wherein the second magnetic layer includes a plurality of structures that at least partially define a pattern, the plurality of structures including at least one structure and at least one remaining structure, the at least one structure configured to generate a magnetic field having a first magnetic field direction at the active layer, the at least one remaining structure configured to generate a magnetic field having a second magnetic field direction at the active layer, the first and second magnetic field directions at the active layer being substantially parallel to the upper surface of the active layer, and the first and second magnetic field directions at the active layer being different directions.

* * * * *